US009547048B2

(12) United States Patent
Romero

(10) Patent No.: US 9,547,048 B2
(45) Date of Patent: Jan. 17, 2017

(54) CIRCUIT AND METHOD FOR REDUCING AN OFFSET COMPONENT OF A PLURALITY OF VERTICAL HALL ELEMENTS ARRANGED IN A CIRCLE

(71) Applicant: Allegro Microsystems, LLC, Worcester, MA (US)

(72) Inventor: Hernan D. Romero, Olivos Buenos Aires (AR)

(73) Assignee: Allegro MicoSystems, LLC, Worcester, MA (US)

( * ) Notice: Subject to any disclaimer, the term of this patent is extended or adjusted under 35 U.S.C. 154(b) by 203 days.

(21) Appl. No.: 14/155,047

(22) Filed: Jan. 14, 2014

(65) Prior Publication Data

US 2015/0198677 A1    Jul. 16, 2015

(51) Int. Cl.
| | |
|---|---|
| G01B 7/30 | (2006.01) |
| G01B 7/14 | (2006.01) |
| G01R 33/06 | (2006.01) |
| H01L 43/06 | (2006.01) |
| G01R 33/00 | (2006.01) |
| G01R 33/07 | (2006.01) |

(52) U.S. Cl.
CPC ......... G01R 33/0017 (2013.01); G01R 33/077 (2013.01)

(58) Field of Classification Search
CPC ... G01R 33/0017; G01R 33/077; G01R 33/06; G01R 33/07; G01R 33/075; G01R 15/20; G01R 15/202
USPC ............... 324/207.2, 207.23–207.25, 117 H; 73/514.31; 323/294, 368
See application file for complete search history.

(56) References Cited

U.S. PATENT DOCUMENTS

| | | | |
|---|---|---|---|
| 4,668,914 A | 5/1987 | Kersten et al. | |
| 4,761,569 A | 8/1988 | Higgs | |
| 4,829,352 A | 5/1989 | Popovic et al. | |
| 5,541,506 A | 7/1996 | Kawakita et al. | |
| 5,572,058 A * | 11/1996 | Biard | H01L 27/22 257/421 |
| 5,604,433 A * | 2/1997 | Theus | G01R 33/07 324/225 |
| 5,612,618 A | 3/1997 | Arakawa | |
| 5,619,137 A | 4/1997 | Vig et al. | |
| 5,621,319 A | 4/1997 | Bilotti et al. | |

(Continued)

FOREIGN PATENT DOCUMENTS

| | | | | |
|---|---|---|---|---|
| CH | WO 2008145662 A1 * | 12/2008 | ............ | G01R 33/07 |
| CN | 101995558 A | 3/2011 | | |

(Continued)

OTHER PUBLICATIONS

Paun et al., Offset and Drift Analysis of the Hall Effect Sensors. The Geometrical Parameters Influence. Jun. 20, 2012. Digest Journal of Nanomaterials and Biostructures, vol. 7, No. 3. Jul.-Sep. 2012, p. 883-891.*

(Continued)

*Primary Examiner* — Bot LeDynh
*Assistant Examiner* — Sean Curtis
(74) *Attorney, Agent, or Firm* — Daly, Crowley, Mofford and Durkee, LLP

(57) ABSTRACT

Output signals from two or more vertical Hall elements arranged in a circle are combined is ways that reduce an offset voltage as the two or more vertical Hall elements are sequenced to generated a sequential output signal.

38 Claims, 17 Drawing Sheets

(56) References Cited

U.S. PATENT DOCUMENTS

| | | | |
|---|---|---|---|
| 5,657,189 A | 8/1997 | Sandhu | |
| 5,694,038 A | 12/1997 | Moody et al. | |
| 5,831,513 A | 11/1998 | Lue | |
| 5,844,411 A | 12/1998 | Vogt | |
| 5,942,895 A * | 8/1999 | Popovic | G01R 1/07 324/117 H |
| 6,064,199 A | 5/2000 | Walter et al. | |
| 6,064,202 A * | 5/2000 | Steiner | G01R 33/075 324/225 |
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 * | 4/2003 | Drapp | G01R 33/07 257/425 |
| 6,545,462 B2 * | 4/2003 | Schott | G01D 5/145 324/207.2 |
| 6,622,012 B2 | 9/2003 | Bilotti et al. | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 * | 5/2006 | Schott | G01R 33/05 324/251 |
| 7,053,674 B1 * | 5/2006 | Romero | G11C 27/026 327/62 |
| 7,085,119 B2 | 8/2006 | Bilotti et al. | |
| 7,119,538 B2 * | 10/2006 | Blossfeld | G01D 5/147 324/207.2 |
| 7,159,556 B2 | 1/2007 | Yoshihara | |
| 7,235,968 B2 * | 6/2007 | Popovic | G01R 33/077 324/247 |
| 7,259,556 B2 * | 8/2007 | Popovic | G01R 33/06 324/202 |
| 7,307,824 B2 | 12/2007 | Bilotti et al. | |
| 7,362,094 B2 | 4/2008 | Voisine et al. | |
| 7,425,821 B2 * | 9/2008 | Monreal | G01D 3/02 324/117 H |
| 7,518,414 B2 * | 4/2009 | Romero | G11C 27/024 327/58 |
| 7,605,647 B1 * | 10/2009 | Romero | G01R 33/072 330/6 |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,797,604 B2 | 9/2010 | Lee et al. | |
| 7,872,322 B2 * | 1/2011 | Schott | G01R 33/07 257/426 |
| 7,911,203 B2 | 3/2011 | Thomas et al. | |
| 7,965,076 B2 | 6/2011 | Schott | |
| 7,990,209 B2 * | 8/2011 | Romero | H03H 19/004 327/554 |
| 7,994,774 B2 | 8/2011 | Thomas et al. | |
| 8,324,891 B2 * | 12/2012 | Kejik | G01R 33/07 324/207.11 |
| 8,416,014 B2 * | 4/2013 | Romero | H03H 19/004 327/552 |
| 8,564,285 B2 * | 10/2013 | Romero | G01R 33/07 324/251 |
| 8,624,587 B2 * | 1/2014 | Popovic | 324/207.11 |
| 8,749,005 B1 * | 6/2014 | Foletto | 257/427 |
| 8,786,279 B2 * | 7/2014 | Petrie | G01R 33/0029 324/251 |
| 8,860,410 B2 * | 10/2014 | Petrie | 257/421 |
| 8,890,518 B2 * | 11/2014 | Daubert | 324/207.2 |
| 8,896,303 B2 * | 11/2014 | Ausserlechner | G01R 33/07 257/425 |
| 8,922,206 B2 * | 12/2014 | Friedrich | 257/427 |
| 8,922,207 B2 * | 12/2014 | Ausserlechner | G01R 33/07 324/251 |
| 8,937,797 B2 * | 1/2015 | Pirchio | G01R 31/026 330/264 |
| 8,963,540 B2 * | 2/2015 | Reymond | G01D 5/145 324/207.11 |
| 8,981,504 B2 * | 3/2015 | Motz | G01R 33/07 257/414 |
| 8,988,072 B2 * | 3/2015 | Ausserlechner | G01R 33/075 324/207.22 |
| 9,007,060 B2 * | 4/2015 | Ausserlechner | G01L 1/12 324/207.2 |
| 9,024,622 B2 * | 5/2015 | Hohe | G01R 33/0017 324/202 |
| 9,046,383 B2 * | 6/2015 | Friedrich | F16H 59/70 |
| 9,062,990 B2 * | 6/2015 | Petrie | G01D 5/145 |
| 9,099,638 B2 | 8/2015 | Wang | |
| 9,182,456 B2 * | 11/2015 | Shoemaker | G01R 33/075 |
| 9,252,355 B2 * | 2/2016 | Vanderhaegen | H01L 43/065 |
| 9,274,183 B2 * | 3/2016 | Ausserlechner | G01R 33/07 |
| 9,285,439 B2 * | 3/2016 | Motz | G01R 33/07 |
| 9,312,472 B2 | 4/2016 | Ausserlechner | |
| 9,377,285 B2 * | 6/2016 | Romero | G01B 7/023 |
| 9,389,060 B2 * | 7/2016 | Romero | G01R 33/0023 |
| 9,400,164 B2 * | 7/2016 | Daubert | G01B 7/30 |
| 9,423,471 B2 * | 8/2016 | Ausserlechner | G01R 33/077 |
| 9,425,386 B2 * | 8/2016 | Ausserlechner | H01L 43/065 |
| 2002/0114269 A1 | 8/2002 | Onggosanusi et al. | |
| 2005/0264348 A1 * | 12/2005 | Bilotti | H03H 11/04 327/559 |
| 2006/0011999 A1 * | 1/2006 | Schott | G01R 33/07 257/421 |
| 2006/0125531 A1 * | 6/2006 | Romero | G11C 27/024 327/94 |
| 2007/0105244 A1 | 5/2007 | Okita | |
| 2008/0094055 A1 * | 4/2008 | Monreal | G01D 3/02 324/117 H |
| 2008/0100285 A1 | 5/2008 | Matsumoto et al. | |
| 2009/0001965 A1 * | 1/2009 | Ausserlechner | G01D 5/145 324/202 |
| 2009/0121707 A1 | 5/2009 | Schott | |
| 2009/0174395 A1 | 7/2009 | Thomas et al. | |
| 2010/0026282 A1 | 2/2010 | Kaita et al. | |
| 2010/0156397 A1 | 6/2010 | Yabusaki et al. | |
| 2010/0164491 A1 * | 7/2010 | Kejik | G01R 33/077 324/251 |
| 2010/0181993 A1 | 7/2010 | Fernandez et al. | |
| 2010/0321105 A1 * | 12/2010 | Romero | H03H 19/004 327/554 |
| 2011/0018533 A1 * | 1/2011 | Cesaretti | G01R 33/0035 324/251 |
| 2011/0101975 A1 * | 5/2011 | Popovic | G01R 15/18 324/251 |
| 2011/0221518 A1 * | 9/2011 | Romero | H03H 19/004 327/554 |
| 2011/0248708 A1 | 10/2011 | Thomas et al. | |
| 2012/0016614 A1 * | 1/2012 | Hohe | G01R 33/0017 702/85 |
| 2012/0025817 A1 * | 2/2012 | Romero | G01R 33/07 324/251 |
| 2012/0217955 A1 * | 8/2012 | Petrie | G01D 5/145 324/207.2 |
| 2012/0218018 A1 * | 8/2012 | Petrie | G01R 33/0029 327/187 |
| 2012/0286776 A1 * | 11/2012 | Ausserlechner | G01R 33/07 324/251 |
| 2012/0299588 A1 * | 11/2012 | Petrie | G01R 33/077 324/251 |
| 2012/0313635 A1 * | 12/2012 | Daubert | G01R 33/077 324/251 |
| 2013/0021026 A1 * | 1/2013 | Ausserlechner | G01L 1/12 324/251 |
| 2013/0021027 A1 * | 1/2013 | Ausserlechner | G01R 33/075 324/251 |
| 2013/0057257 A1 * | 3/2013 | Friedrich | G01R 33/077 324/207.2 |

(56) References Cited

U.S. PATENT DOCUMENTS

| | | | |
|---|---|---|---|
| 2013/0179115 A1* | 7/2013 | Friedrich | F16H 59/70 702/150 |
| 2013/0214774 A1* | 8/2013 | Cesaretti | G01R 33/0023 324/251 |
| 2013/0214775 A1* | 8/2013 | Ausserlechner | H01L 43/065 324/251 |
| 2013/0238278 A1* | 9/2013 | Shoemaker | G01R 33/075 702/145 |
| 2013/0242447 A1* | 9/2013 | Pirchio | G01R 31/026 361/101 |
| 2013/0265037 A1* | 10/2013 | Friedrich | G01R 33/07 324/207.2 |
| 2013/0293220 A1* | 11/2013 | Metivier | G01B 7/30 324/207.2 |
| 2013/0342194 A1* | 12/2013 | Motz | G01R 33/07 324/251 |
| 2013/0342195 A1* | 12/2013 | Ausserlechner | H01L 43/065 324/251 |
| 2014/0009144 A1* | 1/2014 | Romero | G01R 33/07 324/251 |
| 2014/0028304 A1* | 1/2014 | Ausserlechner | G01R 33/075 324/251 |
| 2014/0070796 A1* | 3/2014 | Reymond | G01D 5/145 324/207.2 |
| 2014/0175584 A1* | 6/2014 | Foletto | H01L 29/82 257/427 |
| 2014/0176125 A1* | 6/2014 | Friedrich | G01R 33/0023 324/207.2 |
| 2014/0176126 A1* | 6/2014 | Friedrich | G01R 33/02 324/207.2 |
| 2014/0210023 A1* | 7/2014 | Wang | H01L 43/065 257/421 |
| 2014/0210461 A1* | 7/2014 | Ausserlechner | G01R 33/075 324/251 |
| 2014/0225597 A1* | 8/2014 | Romero | G01R 33/0023 324/207.12 |
| 2014/0225598 A1* | 8/2014 | Romero | G01B 7/023 324/207.12 |
| 2014/0264667 A1* | 9/2014 | Wang | H01L 43/065 257/421 |
| 2014/0347044 A1* | 11/2014 | Monreal | G01R 33/07 324/251 |
| 2015/0022188 A1* | 1/2015 | Daubert | G01B 7/30 324/207.12 |
| 2015/0070002 A1* | 3/2015 | Schott | G01D 5/145 324/207.2 |
| 2015/0137805 A1* | 5/2015 | Motz | G01R 33/07 324/251 |
| 2015/0153425 A1* | 6/2015 | Ausserlechner | G01R 33/075 324/251 |
| 2015/0168508 A1* | 6/2015 | Ausserlechner | H01L 43/065 324/251 |
| 2015/0176963 A1* | 6/2015 | Diaconu | G01R 33/077 702/95 |
| 2015/0176964 A1* | 6/2015 | Uberti | G01R 33/0029 702/95 |
| 2015/0198677 A1* | 7/2015 | Romero | G01R 33/077 324/207.2 |
| 2015/0207061 A1* | 7/2015 | Ausserlechner | G01L 1/12 257/421 |
| 2015/0301149 A1* | 10/2015 | Cesaretti | G01R 33/075 324/202 |
| 2015/0316623 A1* | 11/2015 | Romero | G01R 33/077 324/251 |
| 2015/0338473 A1* | 11/2015 | Diaconu | G01R 33/0029 324/251 |
| 2015/0346289 A1* | 12/2015 | Ausserlechner | G01R 33/07 324/251 |
| 2015/0354985 A1* | 12/2015 | Judkins, III | G01D 5/142 324/207.14 |
| 2015/0369881 A1* | 12/2015 | Ausserlechner | G01R 33/07 324/251 |
| 2016/0097826 A1* | 4/2016 | Ausserlechner | H01L 43/065 324/251 |
| 2016/0139214 A1* | 5/2016 | Ausserlechner | G01R 33/077 324/251 |
| 2016/0146905 A1* | 5/2016 | Diaconu | G01R 33/0017 324/251 |

FOREIGN PATENT DOCUMENTS

| | | |
|---|---|---|
| CN | 102171588 A | 8/2011 |
| CN | 102193073 A | 9/2011 |
| DE | 10 2005 014 509 B4 | 10/2006 |
| DE | 10 2006 037 226 A1 | 2/2008 |
| DE | 10 2007 036 984 A1 | 1/2009 |
| DE | 10 2010 010 560 B3 | 9/2011 |
| EP | 0 631 416 B1 | 12/1994 |
| EP | 0 875 733 B1 | 11/1998 |
| EP | 0 916 074 B1 | 5/1999 |
| EP | 2 000 814 A1 | 12/2008 |
| EP | 2 000 814 A2 | 12/2008 |
| EP | 2 000 814 A3 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| TW | 200643376 | 12/2006 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 03/036733 A2 | 5/2003 |
| WO | WO 03/036733 A3 | 5/2003 |
| WO | WO 2004/025742 A1 | 3/2004 |
| WO | WO 2005/029106 A1 | 3/2005 |
| WO | WO 2006/056289 A1 | 6/2006 |
| WO | WO 2006/074989 A2 | 7/2006 |
| WO | WO 2008/145662 A1 | 12/2008 |
| WO | WO 2008 145662 A1 | 12/2008 |
| WO | WO 2009/124969 A1 | 10/2009 |
| WO | WO 2009/124969 A1 | 10/2009 |

OTHER PUBLICATIONS

Kaufmann et al.; "Novel Coupling Concept for Five-Contact Vertical Hall Devices;" 16th International Solid-State Sensors, Actuators and Microsystems (Transducers) Conference; Jun. 5-9, 2011; 4 sheets.

PCT International Preliminary Report on Patentability and Written Opinion of the ISA dated Apr. 10, 2014; for PCT Pat. App. No. PCT/US2012/052639; 19 pages.

Banjevic; "High Bandwidth CMOS Magnetic Sensors Based on the Miniaturized Circular Vertical Hall Device;" Sep. 2001; 153 pages.

Notice of Allowance dated Jun. 11, 2014; from U.S. Appl. No. 13/113,603; 30 pages.

Office Action dated Jul. 18, 2014 for U.S. Appl. No. 13/035,243, filed Feb. 25, 2011.

Response filed Dec. 4, 2014; to Office Action dated Jul. 18, 2014; for U.S. Appl. No. 13/035,243; 19 pages.

Notice of Allowance dated Feb. 23, 2015; for U.S. Appl. No. 13/035,243; 8 pages.

PCT Search Report and Written Opinion of the ISA dated Mar. 19, 2015; for PCT Pat. App. No. PCT/US2014/072042; 20 pages.

U.S. Appl. No. 14/717,448, filed May 20, 2015, Petrie.

Notice of Allowance dated Jul. 9, 2015; for U.S. Appl. No. 14/717,442; 19 pages.

Office Action dated Jun. 3, 2013; for U.S. Appl. No. 13/035,257: 25 pages.

Response filed Aug. 20, 2013; to Office Action dated Jun. 3, 2013; for U.S. Appl. No. 13/035,257; 13 pages.

Final Office Action dated Oct. 30, 2013; for U.S. Appl. No. 13/035,257, 21 pages.

Response to Final Office Action filed Jan. 29, 2014 to Final Office Action dated Oct. 30, 2013; for U.S. Appl. No. 13/035,257; 23 pages.

(56) References Cited

OTHER PUBLICATIONS

Notice of Allowance dated Mar. 14, 2014; for U.S. Appl. No. 13/035,257; 7 pages.
Taiwan Office Action dated Feb. 18, 2014; for TW Pat. App. No. 101132371; 7 pages.
Taiwan Office Action (English translation) dated Feb. 18, 2014; for TW Pat. App. No, 101132371; 8 pages.
PCT Search Report and Written Opinion of the ISA; dated May 7, 2012; for PCT Pat. App. No. PCT/US2012/024426; 12 pages.
PCT International Preliminary Report on Patentability and Written Opinion of the ISA; dated Sep. 6, 2013; for PCT Pat. App. No. PCT/US2012/024426; 11 pages.
PCT Search Report and Written Opinion; dated Nov. 268, 2012; for PCT Pat. App. No. PCT/US2012/034802; 13 pages.
PCT International Preliminary Report on Patentability and Written Opinion of the ISA dated Dec. 5, 2013; for PCT Pat. App. PCT/US2012/034892; 10 pages.
PCT Invitation to Pay Additional Fees with Partial Search Report; dated Feb. 6, 2013; for PCT Pat. App. No. PCT/US2012/052639; 7 pages.
PCT Search Report and Written Opinion of the ISA; dated May 21, 2013; for PCT Pat. App. No. PCT/US2012/052639; 25 pages.
Banjevic; "High Bandwidth CMOS Magnetic Sensors Based on the Miniaturized Circular Vertical Hall Device;" Ecole Polytechnique Federale DeLausanne; These N 5114; Jan. 2011; 153 pages.
Reymond et al.; "Circular Hall Transducer for Angular Position Sensing;" 2007 IEEE Sensors Conference; Mar. 2007; pp. 2593-2596.
Schurig et al.; "CMOS Integrated Vertical Hall Sensor with Low Offset;" 16th European Conference on Solid-State Transducers; Sep. 15-18, 2002; pp. 868-871.
Office Action/Restriction Requirement dated Nov. 20, 2013; for U.S. Appl. No. 13/062,246; 6 pages.
Response and Preliminary Amendment filed Jan. 20, 2014; to Office Action/Restriction Requirement dated Nov. 20, 2013; for U.S. Appl. No. 13/062,246; 12 pages.
PCT Search Report and Written Opinion of the ISA; dated Jul. 2, 2012; for PCT Pat. App. No. PCT/US2012/024424; 14 pages.
PCT International Preliminary Report on Patentability and Written Opinion of the ISA; dated Sep. 6, 2013; for PCT Pat. App. No. PCT/US2012/024424; 11 pages.
Allegro Microsystems, Inc.; "High Precision Linear Hall Effect Sensor IC with a Push/Pull, Pulse Width Modulated Output;" A1351; pp. 1-23.
Allegro Microsystems, Inc.; "High Precision 2-Wire Linear Hall Effect Sensor IC with a Pulse Width Modulated Output;" A1354; pp. 1-22.
Allegro Microsystems, Inc.; "High Precision Linear Hall-Effect Sensor with an Open Drain Pulse Width Modulated Output;" A1356; pp. 1-20.
Allegro Microsystems, Inc.; "Low-Noise Programmable Linear Hall Effect Sensor ICs with Adjustabie Bandwidth (50 kHz Maximum) and Analog Output;" A1360, A1361 and A1362; pp. 1-25.
Baschirotto et al.; "Development and Analysis of a PCB Vector 2-D Magnetic Field Sensor System for Electronic Compasses," IEEE Sensors Journal, vol. 6, No. 2; Apr. 2006; pp. 365-371.
Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.
Kejik,.et al.; "Ultra Low-Power Angular Position Sensor for High-Speed Portable Applications," 2009 IEEE Sensors Conference; Oct. 25-28, 2009; pp. 173-176.
Reymond, et al.; "True 2D CMOS Integrated Hall Sensor;" 2007 IEEE Sensors Conference; Oct. 28-31, 2007; pp. 860-863.
Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.
Melexis Microelectronic Integrated Systems; MLX90333; "Triaxis 3D-Joystick Position Sensor;" Data Sheet; Mar. 2009; 43 pages.

MEMSIC Corporation; AN-00MM-004: "Electronic Tilt Compensation;" Mar. 2008; 5 pages.
MEMSIC Corporation; AN-00MM-003; "Magnetic Sensor Calibration;" Mar. 2008; 5 pages.
MEMSIC Corporation; AN-00MM-002; "Magnetometer Soldering Methodology;" Jun. 2008; 2 pages.
MEMSIC Corporation; AN-00MM-001; "Magnetometer Fundamentals;" Jun. 2008; 6 pages.
MEMSIC Corporation; AN-00MM-005; "Magnetic Sensor Placement Guidelines;" Oct. 2008; 2 pages.
MEMSIC Corporation; MMC312xMQ; "Tri-axis Magnetic Sensor, with I$^2$C Interface;" Aug. 14, 2008; 9 pages.
MEMSIC Corporation; MMC314xMS; "Ultra Small 3-axis Magnetic Sensor, with I$^2$C Interface;" Mar. 31, 2010; 8 pages.
Micronas GmbH; "HAL® 3625 Programmable Direct Angle Sensor;" Product Information; Sep. 2009; 2 pages.
Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.
Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.: "A1351 Data Sheet: High Precision Linear Hall Effect Sensor with a Push/Pull, Pulse Width Modulated Output;" published Mar. 7, 2008; pp. 1-23.
Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.
Allegro Microsystems, Inc.; "A3212 Data Sheet: Micropower, Ultra-Sensitive Hall-Effect Switch;" published Sep. 22, 2004; pp. 1-12.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010: pp. 1-40.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10.
Atherton et al.; "Sensor Signal Conditioning—an IC Designer's Perspective;" IEEE Electro International; Apr. 26-28, 1991; pp. 129-134.
Austria Microsystems; "AS5040 datasheet; 10-Bit Programmable Magnetic Rotary Encoder;" Revision 1.1; Jan. 2004; pp. 1-20.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.
Blanchard et al.; "Cylindrical Hall Device;" International Electron Devices Meeting; Dec. 8-11, 1996; pp. 541-544.
Burger et al.; "New fully integrated 3-D silicon Hall sensor for precise angular-position measurements;" Sensors and Actuators, A 67; May 1998; pp. 72-76.
Dwyer; "Allegro Microsystems, Inc.; AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Journal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.

(56) References Cited

OTHER PUBLICATIONS

Häberli et al.; "Contactless Angle Measurements by CMOS Magnetic Sensor with On Chip Read-Out Circuit;" The 8th International Conference on Solid-State Sensors and Actuators and Eurosensors IX; Jan. 25-29, 1995; pp. 134-137.

Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceedings of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensors;" Sensor × Text Conference; Proceedings II; May 2009; pp. 41-46.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Actuators, vol. A21-A23; Jan. 1990; pp. 743-746.

Novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The 8th International Conference on Solid-State Sensors and Acutators, Physical vol. 53, Issues 1-3; May 1996; pp. 278-283.

Petoussis et al.; "A Novel Hall Effect Sensor Using Elaborate Offset Cancellation Method;" Sensors & Transducers Journal, vol. 100, Issue 1; Jan. 2009; pp. 85-91.

Popovic; "Not-plate-like Hall magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.

SENSIMA technology sa; "CVHD: a new concept of Angular Position Sensor;" Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20~%202SA-10.pdf; pp. 1-7.

van der Meer; et al.; "CMOS quad spinning-current Hall-sensor system for compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.

Drljaca, et al.; "Nonliner Effects in Magnetic Angular Position Sensor With Integrated Flux Concentrator;" Proc. 23rd International Conference on Microelectronics (MIEL 2002); vol. 1; NIS; Yugoslavia; May 12-15, 2002; pp. 223-226.

Petrie; "Circular Vertical Hall Magnetic Field Sensing Element and Method with a Plurality of Continuous Output Signals;" U.S. Appl. No. 13/035,243, filed Feb. 25, 2011; 56 pages.

Melexis MLX 90324; ""Under-the-Hood" Triaxis Rotary Position feat. SENT Protocol;" 3901090324 Data Sheet; Dec. 2008; 40 pages.

PCT International Preliminary Report on Patentability dated Jul. 28, 2016 for PCT Application No. PCT/US2014/072042; 17 pages.

\* cited by examiner

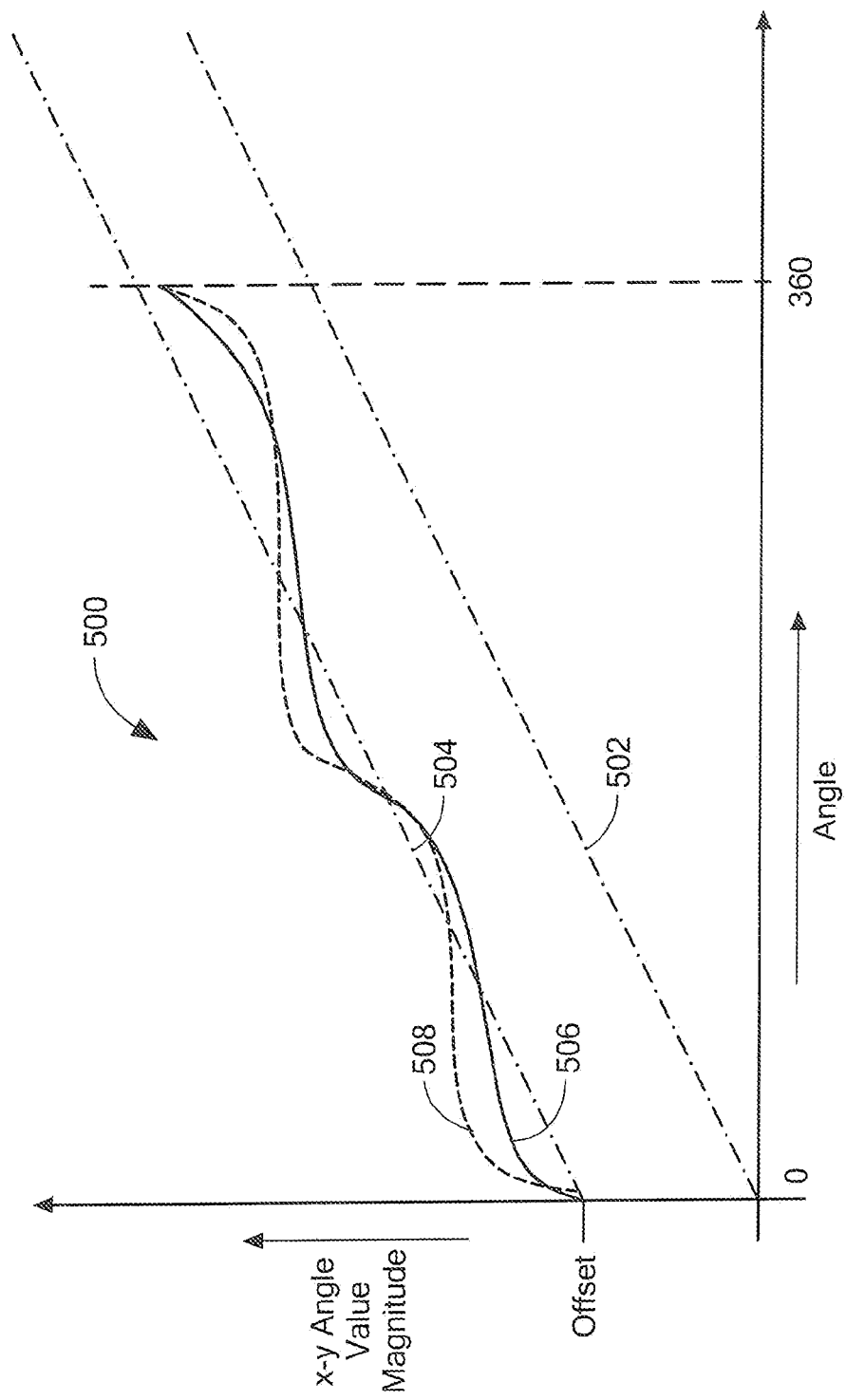

CIRCUIT AND METHOD FOR REDUCING AN OFFSET COMPONENT OF A PLURALITY OF VERTICAL HALL ELEMENTS ARRANGED IN A CIRCLE

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to a magnetic field sensor having a plurality of vertical Hall elements that are combined in ways that reduce an offset component.

BACKGROUND

Magnetic field sensing elements can be used in a variety of applications. In one application, a magnetic field sensing element can be used to detect a direction of a magnetic field, i.e., and angle of the direction of the magnetic field.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant and diffusion region in a substrate. The common implant and diffusion region can be a common epi (epitaxial) region (e.g., layer) upon a substrate, bounded by semiconductor isolation structures. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element is but one element that can provide an output signal representative of an angle of a magnetic field, i.e., an angle sensor. For example, an angle sensor can be provided from a plurality of separate vertical Hall elements or a plurality of magnetoresistance elements arranged in a circle. Collectively, magnetic field sensing element(s) that generate an output signal related to an angle of a magnetic field are referred to herein "angle sensing elements."

More parameters can characterize the performance of and angle sensing element(s), e.g., a CVH sensing element. One such parameter is an angular accuracy of the output signal generated by the angle sensing element(s). Angular accuracy can have both an average angle error that is the same at all magnetic field pointing angles, and also an angle error that is different at different magnetic field angles (i.e. a non-linearity error). Another parameter is the speed with which the angle sensing element(s) can convey the angle of the magnetic field. It will be understood that the speed is particularly important for applications in which the angle of the magnetic field may be rapidly changing.

It is known that some parameters that can characterize an angle sensing element tend to change with temperature.

It would be desirable to provide circuits and techniques that can process output signals from an angle sensing element to provide an output signal that has a high degree of angle accuracy and a relatively high speed.

SUMMARY

The present invention provides circuits and techniques that can process output signals from an angle sensing element to provide an output signal that has a high degree of angle accuracy and a relatively high speed.

In accordance with one aspect, a magnetic field sensor includes a plurality of vertical Hall elements arranged in a circle and formed as a corresponding plurality of sets of contacts among a plurality of contacts disposed upon a substrate. The plurality of vertical Hall elements is configured to generate a corresponding plurality of vertical Hall element output signals. Each one of the plurality of vertical Hall elements is responsive to an external magnetic field having an external magnetic field direction. Each one of the vertical Hall element output signals comprises a respective external magnetic field component responsive to the external magnetic field and a respective offset error component. The magnetic field sensor also includes a sequence switches circuit coupled to receive the plurality of vertical Hall element output signals and configured to select first and second vertical Hall elements from among the plurality of vertical Hall elements. The first vertical Hall element has a first selected set of contacts selected from among the plurality of sets of contacts and the second vertical Hall element has a second selected set of contacts selected from among the plurality of sets of contacts. The first and second vertical Hall elements are configured to generate first and second vertical Hall element output signals, respectively. The first vertical Hall element output signal has a first external magnetic field component responsive to the external magnetic field and a first offset component, and the second vertical Hall element output signal has a second external magnetic field component responsive to the external magnetic field and a second offset component. The sequence switches circuit is further configured to combine the first and second vertical Hall element output signals so that the first and second magnetic field components add constructively to generate a constructive signal. The magnetic field sensor further includes a current switches circuit coupled to receive a current signal and configured to provide a first one or more current signals to a first selected one or more contacts of the first selected set of contacts. The first one or more current signals flow into or out of a central contact of the first selected set of contacts. The current switches circuit is also configured to provide a second one or more current signals to a second selected one or more contacts of the second selected set of contacts. The second one or more current signals flow into or out of a contact proximate to a central contact of the second selected set of contacts. The first and second selected one or more contacts of the first and second vertical Hall elements are representative of first and second different coupling phases, respectively. The sequence switches circuit and the current switches circuit are configured to sequence around the plurality of vertical Hall elements, sequentially selecting the first and second vertical Hall elements as different ones of the plurality of vertical Hall elements in order to generate a constructive sequenced signal.

In accordance with another aspect, a method is used in a magnetic field sensor. The magnetic field sensor includes a plurality of vertical Hall elements arranged as a circle and formed as a corresponding plurality of sets of contacts among a plurality of contacts disposed upon a substrate. The plurality of vertical Hall elements is configured to generate a corresponding plurality of vertical Hall element output signals. Each one of the plurality of vertical Hall elements is responsive to an external magnetic field having an external magnetic field direction. Each one of the vertical Hall element output signals has a respective external magnetic field component responsive to the external magnetic field and a respective offset error component. The method includes selecting first and second vertical Hall elements from among the plurality of vertical Hall elements. The first vertical Hall element has a first selected set of contacts selected from among the plurality of sets of contacts and the second vertical Hall element has a second selected set of contacts selected from among the plurality of sets of contacts. The first and second vertical Hall elements are configured to generate first and second vertical Hall element output signals, respectively. The first vertical Hall element output signal has a first external magnetic field component responsive to the external magnetic field and a first offset component, and the second vertical Hall element output signal has a second external magnetic field component responsive to the external magnetic field and a second offset component. The method also includes combining the first and second vertical Hall element output signals so that the first and second magnetic field components add constructively to generate a constructive signal. The method also includes providing a first one or more current signals to a first selected one or more contacts of the first selected set of contacts. The first one or more current signals flow into or out of a central contact of the first selected set of contacts. The method also includes providing a second one or more current signals to a second selected one or more contacts of the second selected set of contacts. The second one or more current signals flow into or out of a contact proximate to a central contact of the second selected set of contacts. The first and second one or more contacts of the first and second vertical Hall elements are representative of first and second different coupling phases, respectively. The method also includes sequencing around the plurality of vertical Hall elements, sequentially selecting the first and second vertical Hall elements as different ones of the plurality of vertical Hall elements in order to generate a constructive sequenced signal.

BRIEF DESCRIPTION OF THE DRAWINGS

The foregoing features of the invention, as well as the invention itself may be more fully understood from the following detailed description of the drawings, in which:

FIG. 5 is a graph showing ideal and non-ideal operation of the magnetic field sensor of FIG. 3;

DETAILED DESCRIPTION

Figure 1:
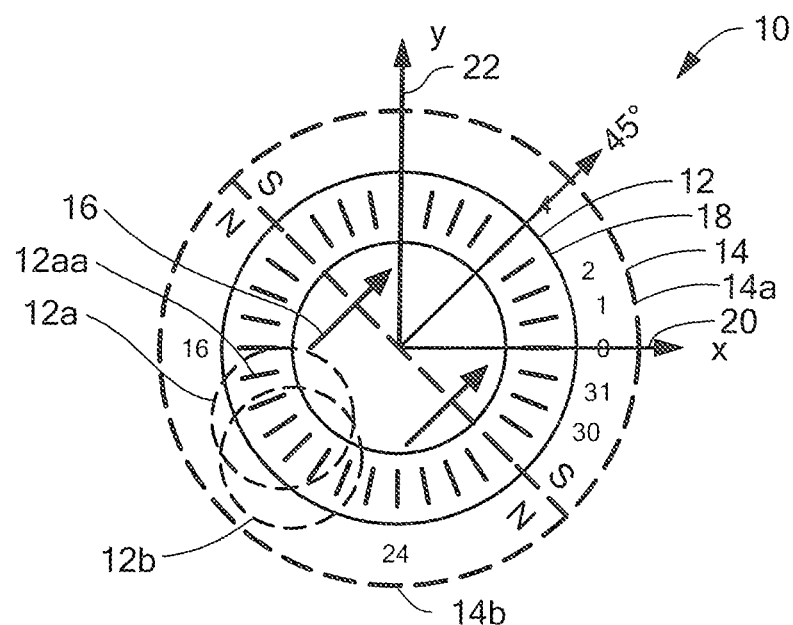
FIG. 1 is a pictorial showing a circular vertical Hall (CVH) sensing element having a plurality of vertical Hall elements arranged in a circle over a common implant region upon a substrate, and a two pole magnet disposed close to the CVH sensing element.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

Referring to FIG. 1, a circular vertical Hall (CVH) element 12 includes a circular implant and diffusion region 18 in a substrate (not shown). The CVH sensing element 12 has a plurality of vertical Hall elements, of which a vertical Hall element 12a is but one example. In some embodiments, the common implant and diffusion region 18 can be characterized as a common epitaxial region upon a substrate, bounded by semiconductor isolation structures.

Each vertical Hall element has a plurality of Hall element contacts (e.g., four or five contacts), e.g., 12aa. Each vertical Hall element contact can be comprised of a metal contact over a contact diffusion region (a pickup) diffused into the common implant and diffusion region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 0 can be positioned along an x-axis 20 and a center of vertical Hall element 8 can be positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14b and a south side 14a can be disposed over the CVH 12. The circular magnet 14 tends to generate a magnetic field 16 having a direction from the north side 14b to the south side 14a, here shown to be pointed to a direction of about forty-five degrees relative to x-axis 20.

In some applications, the circular magnet 14 is mechanically coupled to a rotating target object, for example, an automobile steering shaft of an automobile camshaft, and is subject to rotation relative to the CVH sensing element 12. With this arrangement, the CVH sensing element 12, in combination with an electronic circuit described below, can generate a signal related to the angle of rotation of the magnet 14, i.e., an angle of rotation of the target object to which the magnet is coupled.

Figure 1A:
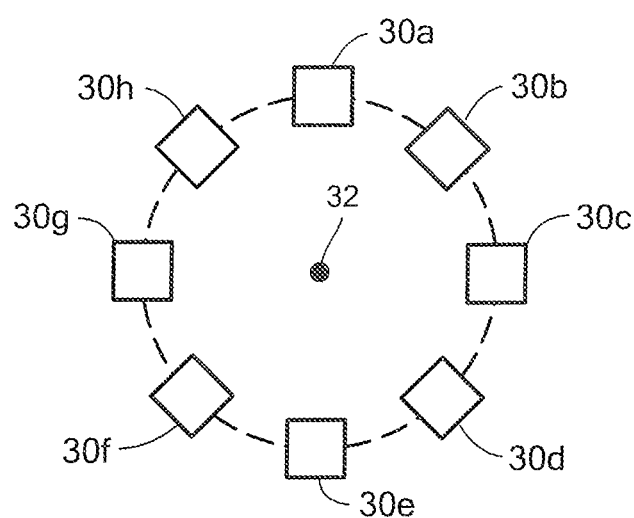
FIG. 1A is pictorial showing a plurality of magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements, each having an axis of maximum response parallel to a surface of a substrate 34. These magnetic field sensing elements can be coupled to an electronic circuit the same as or similar to electronic circuits described below in conjunction with FIGS. 3 and 6. There can also be a magnet the same as or similar to the magnet 14 of FIG. 1 disposed proximate to the magnetic field sensing elements 30a-30h.

Figure 2:
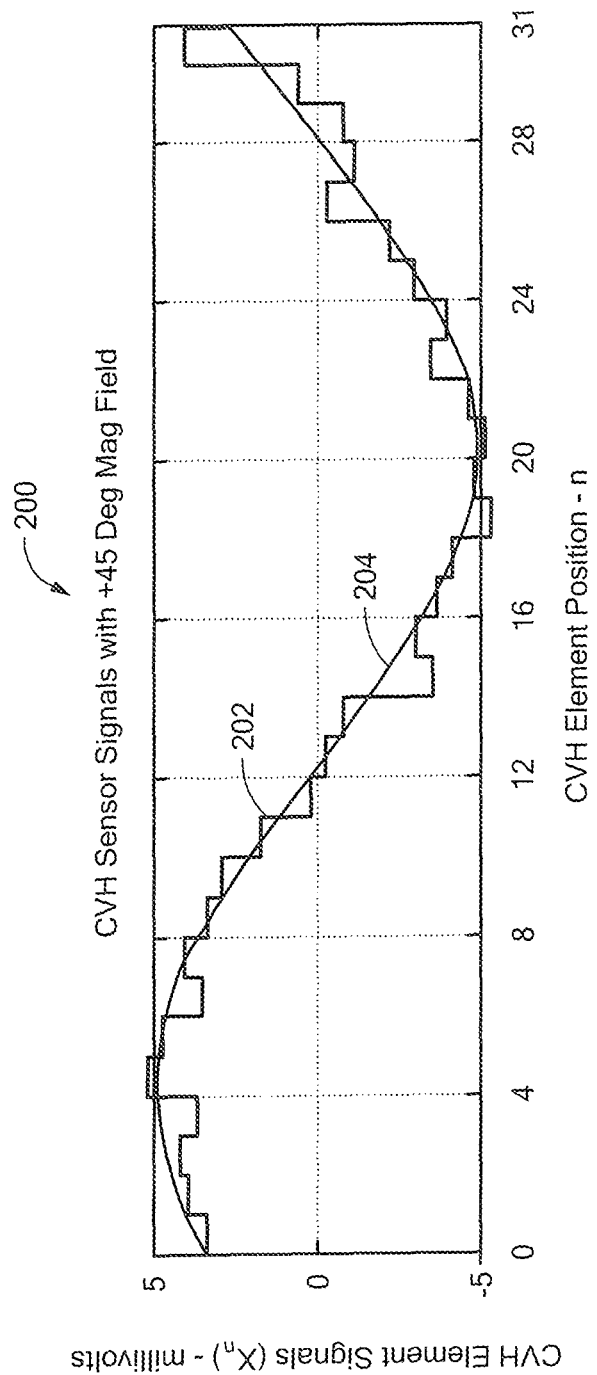
FIG. 2 is a graph showing an output signal as may be generated by the CVH sensing element of FIG. 1 or by the plurality of magnetic field sensing elements of FIG. 1A.

Referring now to FIG. 2, a graph 200 has a horizontal axis with a scale in units of CVH vertical Hall element position, n, around a CVH sensing element, for example, the CVH sensing element 12 of FIG. 1. The graph 200 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 200 includes a signal 202 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 16 pointing at positive forty-five degrees, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 204 is provided to more clearly show ideal behavior of the signal 202. The signal 202 has variations due to vertical Hall element offsets, which tend to cause corresponding variations of output signals causing them to be too high or too low relative to the sine wave 204, in accordance with offset errors for each element. The offset signal errors are undesirable.

Full operation of the CVH sensing element 12 of FIG. 1 and generation of the signal 202 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 202 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 202 when current spinning is not used. However, for embodiments in which current spinning is used, each step of the signal 202 can be comprised of several sub-steps (not shown, e.g., four sub-steps), each sub-step indicative of a current spinning "phase."

Current spinning and current spinning phases are described more fully below in conjunction with FIGS. 4-4D.

It will be understood that a phase of the signal 202 is related to an angle of the magnetic field 16 of FIG. 1 relative to position zero of the CVH sensing element 12. It will also be understood that a peak amplitude of the signal 202 is generally representative of a strength of the magnetic field 16. Using electronic circuit techniques described above in PCT Patent Application No. PCT/EP2008/056517, or using other techniques described below, a phase of the signal 202 (e.g., a phase of the signal 204) can be found and can be used to identify the pointing direction of the magnetic field 16 of FIG. 1 relative to the CVH sensing element 12.

Figure 3:
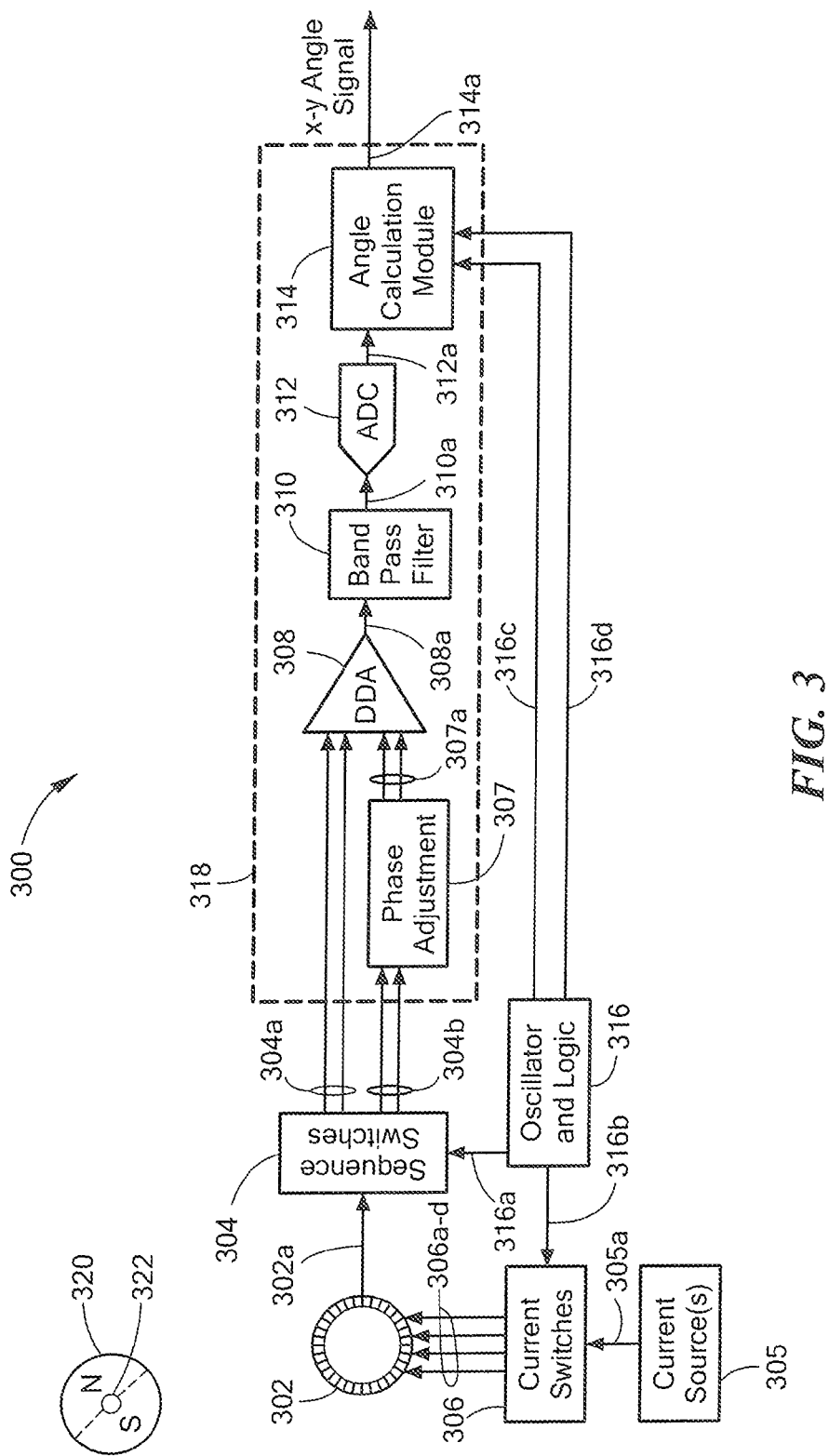
FIG. 3 is a block diagram of an exemplary magnetic field sensor having a CVH sensing element.

Referring now to FIG. 3, a magnetic field sensor 300 includes a CVH sensing element 302 having a plurality of vertical Hall elements, each vertical Hall element comprising a group of vertical Hall element contacts (e.g., five vertical Hall element contacts). In some embodiments, the CVH sensing element 302 can be the same as or similar to the CVH sensing element 12 described above in conjunction with FIG. 1, and can be disposed proximate to a two pole magnet 320 coupled to a target object 322, which magnet 320 can be the same as or similar to the magnet 14 of FIG. 1. However, in some embodiments, the CVH sensing element 302 can be replaced by a group of magnetic field sensing elements the same as or similar to those described above in conjunction with FIG. 1A.

The magnetic field sensor 300 can include a current switches circuit 306 to provide current signals 306a-306d to the CVH sensing element 302. While four current signals 306a-306d are shown, in other embodiments, there can be more than or fewer than four current signals. Essentially, the current switches circuit 306 has access to and can provide current in any combination to any or all of the vertical Hall elements within the CVH sensing element 302.

The magnetic field sensor 300 can also include sequence switches circuit 304. The sequence switches circuit 304 is coupled to receive signals 302a from the CVH sensing element 302. In some embodiments, the signals 302a are representative of signal coupling paths to all vertical Hall elements within the CVH sensing and 302.

From discussion above in conjunction with FIG. 1, it will be appreciated that, in operation, the sequence switches circuit 304 and the current switches circuit 306 can be configured to switch sequentially around the CVH sensing element 302 providing the current signals 306a-306d to different sequential ones of vertical Hall elements within the CVH sensing element 302, and receiving different sequential ones of the signals 302a from the CVH sensing element 302. In some embodiments, the sequencing can include current spinning for each selected one or more of the vertical Hall elements within the CVH sensing element 302. Current spinning is described more fully below in conjunction with FIGS. 4-4C.

From the sequence switches circuit 304 is provided one or more differential output signals, here shown as two differential signals 304a, 304b. It should be understood to both the differential signals 304a, 304b can be sampled analog signals similar to the signal 202 of FIG. 2.

A phase adjustment module 307 can be coupled to either signal path, but is here shown to receive the differential signal 304b and to provide a phase adjusted differential signal 307a. The phase adjustment is described more fully below in conjunction with FIG. 9. A differential amplifier 308 can be coupled to receive the differential signal 304a and the phase adjusted differential signal 307a and configured to generate an amplified signal 308a.

A bandpass filter 310 coupled to receive the amplified signal 308a and configured to generate a filtered signal 300a. It should be understood that the filtered signal 310a can be a sinusoid similar to the signal 204 of FIG. 2.

An analog-to-digital converter (ADC) 312 can be coupled to receive the filtered signal 310a and configured to generate a digital converted signal 312a. An angle calculation module 314 is coupled to receive the converted digital signal 312a and configured to generate an x-y angle signal 314a. As the magnet 320 rotates, values of the x-y angle signal 314a change according to an angle of the magnetic field generated by the magnet 320 in the plane of the CVH sensing element 302.

The angle calculation module 314 is also coupled to receive clock signals 316c, 316d from an oscillator and logic module 316. The clock signals 316c, 316d are used as references by the angle calculation module 314 in order to identify a phase of the converted digital signal 312a, i.e., a phase of the filtered signal 310a. For example, one of the clock signals 316c, 316d can be a clock signal having a frequency the same as the frequency of the filtered signal 310a, i.e., a frequency of the signal 204 of FIG. 2. In operation, phases of the clock signal and of the converted signal 312a can be compared to generate the x-y angle signal 314a, which is indicative of an angle of a magnetic field generated by the magnet 320.

The oscillator and logic module 360 can also provide clock control signals 316a, 316b to the sequence switches circuit 304 and to the current switches circuit 306, respectively. The clocks 316a, 316b result in the sequence switches circuit 304 and the current switches circuit 306 stepping around the CVH sensing element 302, sequentially selected different ones of the vertical Hall elements within the CVH sensing element 302, with or without chopping or current spinning.

Though not shown in FIG. 3 certain ones of the vertical Hall elements within the CVH sensing element 302 can be combined by the sequence switches circuit 304 in ways described more fully below in conjunction with FIGS. 6-16

Figure 4:
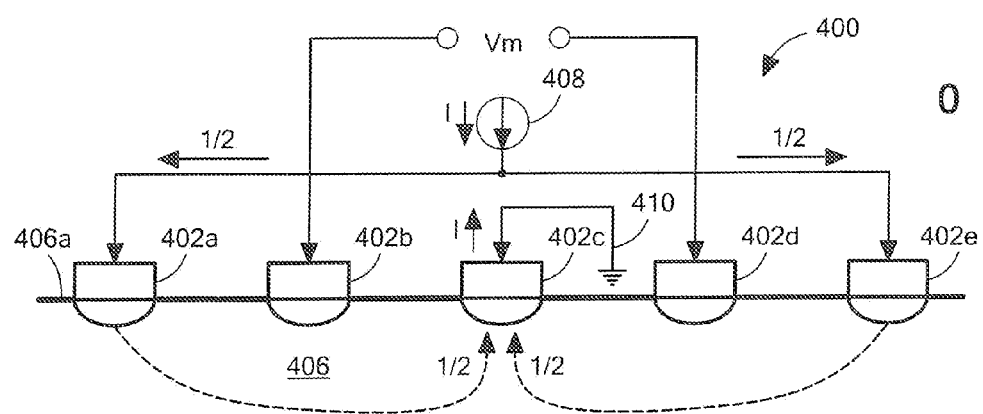
FIGS. 4-4C are block diagrams showing a vertical Hall element of the CVH sensing element of FIG. 3 when coupled into four current spinning phases, each phase associated with operation of one of the vertical Hall elements of the CVH sensing element of FIG. 3.
Figure 4A:
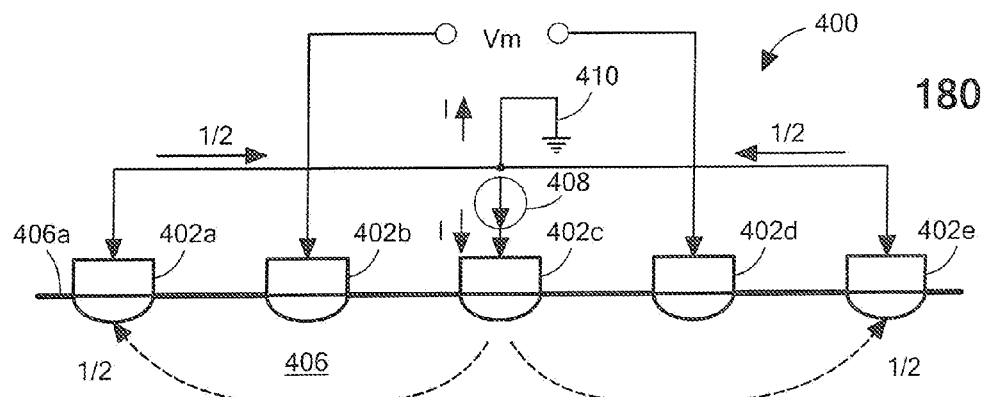
Figure 4B:
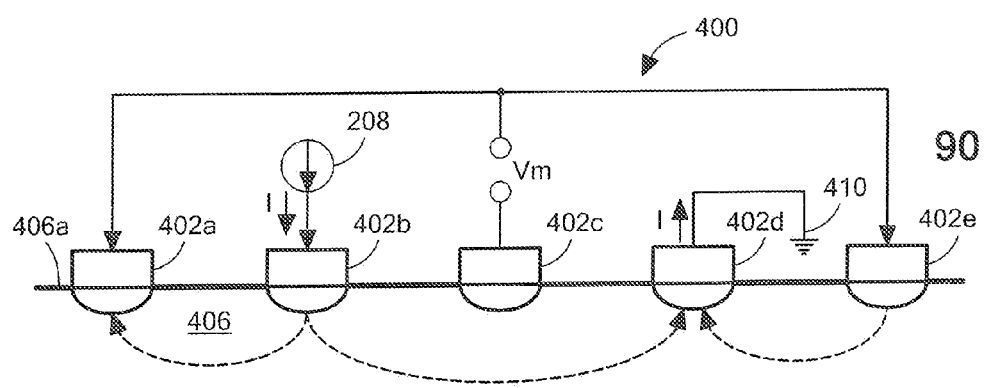
Figure 4C:
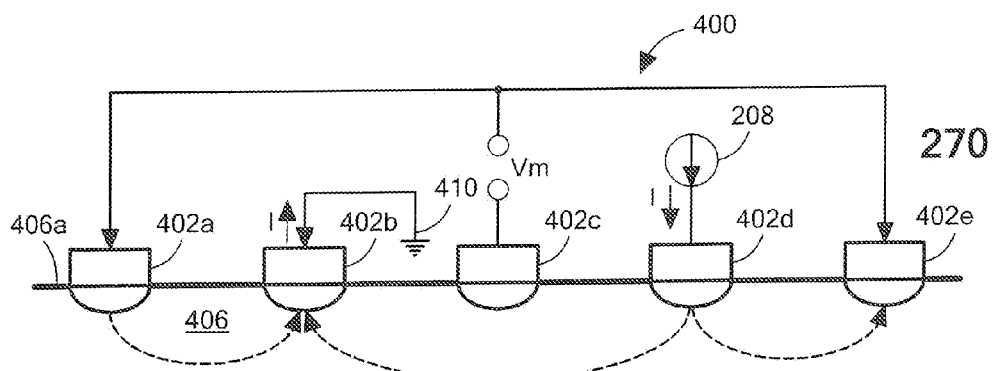

FIGS. 4-4C are representative of a four phase current spinning or chopping that can be used for a vertical Hall element having five contacts. Thus, it should be appreciated that such current spinning can be used for each selected vertical Hall element within the CVH sensing element 12 of FIG. 1 and the CVH sensing element 302 of FIG. 3. It should also be appreciated that such current spinning can also be used for separate magnetic field sensing elements, for example, the magnetic field sensing elements 30a-30h of FIG. 1A, where the magnetic field sensing elements 30a-30h are selected and chopped one of the time.

While all embodiments described herein use vertical Hall elements with five contacts, in other embodiments, the vertical Hall elements have any odd number of contacts. As used herein, the term "central contact" refers to a middle contact of an odd number of contacts.

Orientation of current driven nodes and signal notes of FIGS. 4-4A are shown from the perspective of looking from outside of a ring of vertical Hall elements, e.g., from outside of a CVH sensing element. It will be understood that, naming conventions described below in terms of 0, 90, 180, and 270 degree phases are somewhat arbitrary. These naming conventions come from use of similar naming conventions used for planar Hall effect elements, where, during the sequence of current spinning, current is sequentially injected into nodes that are physically ninety degrees apart. There are no such physical angles that are ninety degrees apart for vertical Hall elements. Nevertheless, FIGS. 4, 4A, 4B, and 4C are referred to herein as zero, ninety, one hundred eighty, and two hundred seventy degrees phases, respectively.

Referring now to FIG. 4, a vertical Hall element 400 of the CVH sensing element 102 of FIG. 3 is comprised of five vertical Hall element contacts, namely, first, second, third, fourth, and fifth vertical Hall element contacts, 402a, 402b, 402c, 402d, 402e, respectively. In a first chopping or current spinning phase (zero degree phase), a current source 408, which can be the same as or similar to the current sources 305 of FIG. 3, can be coupled to the first and fifth vertical Hall element contacts 402a, 402e, respectively, which are coupled together, and can provide a total current of I, half of the current, I/2, flowing to the first vertical a Hall element contact 402a and half of the current, I/2, flowing to the fifth vertical Hall element contact 402e. The third vertical Hall element contact 402c is coupled to a voltage reference 410, for example, ground. Currents from the current source 408 flow from the first and fifth vertical Hall element contacts 402a, 402e, respectively, through a substrate 406 (e.g., through an epitaxial layer upon a substrate) of the CVH sensing element 400 to the third vertical Hall element contact 402c, as represented by dashed lines.

A signal, Vm, responsive to an external magnetic field, results between the second and fourth vertical Hall element contacts 402b, 402d, respectively. Thus, in the first current spinning phase, the current spinning circuit 306 of FIG. 3 can select the second and fourth vertical Hall element contacts 402b, 402d to provide the output signal 105a, and can select the first, fifth, and third vertical Hall element contacts 402a, 402e, 402c, respectively, as those contacts coupled to the current sources 305 of FIG. 3. Couplings during other current spinning phases described below will be apparent.

Referring now to FIG. 4A, in which like elements of FIG. 4 are shown having like reference designations, in a second current spinning phase (one hundred eighty degree phase) of the same vertical Hall element 400 (same five vertical Hall element contacts) of the CVH sensing element 102, couplings are changed by the current switches circuit 306 of FIG. 3. In the second phase, the current source 408 is coupled to the third vertical Hall element contact 402c, and the first and fifth vertical Hal element contacts 402a, 402e, respectively, are coupled together and to the reference voltage 410. Thus, the currents flow through the substrate 406 in opposite directions from those shown in FIG. 4.

As in FIG. 4, a signal, Vm, responsive to an external magnetic field, results between the second and fourth vertical Hall element contacts, 402b, 402d, respectively. The signal, Vm, of FIG. 4A is like the signal, Vm, of FIG. 4. However, the offset voltage within the signals can be different, e.g., different in sign and somewhat different in magnitude.

Referring now to FIG. 4B, in which like elements of FIGS. 4 and 4A are shown having like reference designations, in a third current spinning phase (ninety degree phase) upon the same vertical Hall element 400 (same five vertical Hall element contacts) of the CVH sensing element 102), couplings are again changed by the current switches circuit 306. In the third phase, the current source 408 is coupled to the second vertical Hall element contact 402b, and the fourth vertical Hall element contact 402d is coupled to the reference voltage 410. Thus, a current flows from the second vertical Hall element contact 402b through the substrate 406 to the fourth vertical Hall element contact 402d.

The first and fifth vertical Hall element contacts 402a, 402e, respectively, are coupled together. Some current also flows from the second vertical Hall element contact 402b through the substrate 406 to the first vertical Hall element contact 402a and through the mutual coupling to the fifth vertical Hall element contact 402e. Some current also flows from the fifth vertical Hall element contact 402e through the substrate 406 to the fourth vertical Hall element contact 402d.

A signal, Vm, responsive to an external magnetic field, results between the first vertical Hall element contact 402a first (and the fifth vertical Hall element contact 402e) and the third vertical Hall element contact 402c. The signal, Vm, of FIG. 4B is like the signal, Vm, of FIGS. 4 and 4A. However, the offset voltage within the signal can be different, e.g., different in sign and somewhat different in magnitude.

Referring now to FIG. 4C, in which like elements of FIGS. 4-4B are shown having like reference designations, in a fourth current spinning phase (two hundred seventy degree phase) upon the same vertical Hall element 400 (same five vertical Hall element contacts) of the CVH sensing element 102, couplings are again changed by the current switches circuit 306. In the fourth phase, the current is reversed from that shown in FIG. 4B. The current source 408 is coupled to the fourth vertical Hall element contact 402d, and the second vertical Hall element contact 402b is coupled to the reference voltage 410. Thus, a current flows from the fourth vertical Hall element contact 402d through the substrate 406 to the second vertical Hall element contact 402b.

The first and fifth vertical Hall element contacts 402a, 402e, respectively, are coupled together. Some current also flows from the fourth vertical Hall element contact 402d through the substrate 406 to the fifth vertical Hall element contact 402e, through the mutual coupling to the first vertical Hall element contact 402a. Some current also flows from the first vertical Hall element contact 402a through the substrate 406 to the second vertical Hall element contact 402b.

A signal, Vm, responsive to an external magnetic field, results between the first vertical Hall element contact 402a (and the fifth vertical Hall element contact 402e) and the third vertical Hall element contact 402c. The signal, Vm, of FIG. 4C is like the signal, Vm, of FIGS. 4-4B. However, the offset voltage within the signal can be different, e.g., different in sign and somewhat different in magnitude.

The signals, Vm, provided by the four phases of chopping of FIGS. 4-4C are responsive to an external magnetic field.

As described above, after generating the four current spinning phases on any one vertical Hall element within the CVH sensing element 302, by sequencing operation of the sequence switches circuit 304 of FIG. 3, the current spinning arrangements of FIGS. 4-4C can move to a next vertical Hall element, e.g., five vertical Hall element contacts offset by one (or more) vertical Hall element contact from those shown in FIGS. 4-4C, and the four current spinning phases can be performed on the new vertical Hall element by operation of the current switches circuit 306 and sequence switches circuit 304 of FIG. 3.

It should be understood that the sequence of current spinning phases can be in any order during the current spinning operation.

Referring now to FIG. 5, a graph 500 has a horizontal axis with a scale in units of angular degrees and a vertical axis with a scale in units of value of an x-y angle value magnitude, for example, a magnitude of the x-y angle value 314a of FIG. 3.

A line 502 is representative of an x-y angle value that has no angle error. When the x-y angle value has no angle error, the x-y angle value is perfectly linear with respect to actual angle, i.e., the x-y angle value is a perfect and true representation of the angle of the magnetic field generated by the magnet 320 of FIG. 3, and the line 502 passes through zero.

A line 504 is representative of an x-y angle value that has only an average or DC angle error, such that all angles represented by the x-y angle value are offset by a fixed number of degrees. The line 504 does not pass through zero.

A curve 506 is representative of an x-y angle value that has errors in representation of the true angle of the magnetic field generated by the magnet 320, average or DC errors and also an error that has a sinusoidal appearance.

A curve 508 is representative of an x-y angle value that has other errors in representation of the true angle of the magnetic field generated by the magnet 320.

A variety of circuit characteristics of the magnetic field sensor 300 contribute to the errors, i.e., to both the DC (or average) angle error represented by the curves 506, 508, and to the sinusoidal shapes of the curves 506, 508. One factor that contributes to the errors is switching noise generated by the sequence switches circuit 304 and/or by the current switches circuit 306 of FIG. 3. Another factor is different offset voltages among the vertical Hall elements within the CVH sensing element 302, for example, different offset voltages described above in conjunction with the signal 202 of FIG. 2. Another factor is different sensitivities of the various vertical Hall elements.

First, regarding the sequence switches circuit 304, it will be understood that charge injection or switching spikes (together referred to as noise) generated by the sequence switches circuit 304 are not necessarily exactly the same as each sequential vertical Hall element is selected in the CVH sensing element 302. When the noise generated by the sequence switches circuit 304 is not the same as each vertical Hall element is selected, a DC (or average) angle error is generated and also a sinusoidal type error such as that represented by the curves 506, 508. The sinusoidal error characteristic can be, in part, a result of the noise generated by the sequence switches being repetitive for each cycle around the CVH sensing element 302, and thus, the noise will have an angle error frequency component at a frequency of the signal 202 of FIG. 2, and will add to the signal 502 (304a of FIG. 3). The angle error frequency component is essentially fixed in phase relative the signals 304a, 304b and therefore, the addition of the angle error causes different phase shift errors in the summed signal depending on the phase of the signals 304a, 304b. Higher harmonics can also result from the noise.

Next, regarding the current switches circuit 306, it will be understood that charge injection or switching spikes (together referred to as noise) generated by the current switches circuit 306 are not necessarily exactly the same as each sequential vertical Hall element is selected in the CVH sensing element 302. When the noise generated by the current switches circuit 306 is not the same as each vertical Hall element is selected, a DC (or average) angle error is generated and also a sinusoidal type error such as that represented by the curves 506, 508. The sinusoidal error characteristic can, in part, result from the noise generated by the current switches circuit 306 being repetitive for each cycle around the CVH sensing element.

Other circuit characteristics can also contribute to the angle errors, i.e., to both the DC (or average) angle error represented by the error curves 506, 508, and to the sinusoidal shapes of the error curves 506, 508. Namely, a speed with which the dual differential amplifier 308 of FIG. 3, and also other circuit elements of FIG. 3, are unable to settle to final values as the sequence switches circuit 304 switches among the vertical Hall elements of the CVH sensing element 302, and also as the current switches circuit 306 switch among the various current spinning phases, contribute to the errors.

The above-described circuit characteristics, including, but not limited to, different offset voltages of the various vertical Hall elements within the CVH sensing element 302 of FIG. 3 (including or not including offset mismatches at different current spinning phases), differences of sensitivities of the various vertical Hall elements, and switching noise and lack of circuit elements settling to final values, tend to be influenced by (i.e., changed by) a variety factors including, but not limited to, temperature of the magnetic field sensor 300 of FIG. 3, a rate of sequencing around the CVH sensing element 302, peak magnitude of the magnetic field experience by the CVH sensing element 302 as the magnet 320 rotates, and selected current spinning sequence(s) among the various vertical Hall elements.

Differences between the curves 506, 508 can be attributed to changes in the same factors, namely, changes in the temperature, changes in or differences in peak amplitude of the magnetic field experience by the CVH sensing element 302 as the magnet 320 rotates, changes in offset voltages of the vertical Hall elements within the CVH sensing element 302, changes of sensitivities of the various vertical Hall elements, changes in or differences in rates of sequencing around the CVH sensing element 302, and changes in or differences in selected current spinning sequence(s) among the various vertical Hall elements within the CVH sensing element 302. Among these factors, it will be understood that the changes in the temperature can occur at any time. The changes in the peak amplitude of the magnetic field can be influenced by positional changes, i.e., air gap changes, between the magnet 320 and the CVH sensing element 302 of FIG. 3. The changes in the peak amplitude of the magnetic field can also be influenced by mechanical considerations, for example, wear of a bearing or a shaft upon which the magnet 320 rotates. However, the changes in sequencing rates and the changes in current spinning sequences can be fixed, and changed only for different applications of the magnetic field sensor 300. The changes in offset voltages and changes in sensitivity of the vertical Hall elements tend to be influenced by changes in temperature.

In general, it has been determined that the dominant angle error frequency components occur at first and second harmonics of the frequency of the signal 202 (i.e., 304a, 304b). The curves 506, 508 are representative of angle error functions dominated by first and second harmonics of the frequency of the signal 202 (304a, 304b).

The error curves 506, 508 can be mathematically described in the following way.

Mathematically, the angle error represented by the curves 506, 508 can be represented as:

$$\alpha_{err} = OFF + DC(T) + \sum_{n=1}^{\infty} H_{nA}(T) \cdot \sin(n\alpha + H_{nP}(T)) \qquad (1)$$

where:
α=measured angle with error;
n=a variable indicative of an nth harmonic;
T=temperature of magnetic field sensor 300;
OFF=a magnetic target positioning error, i.e., a mechanical misalignment of the CVH sensing element 302 in relation to the magnet 320 of FIG. 3, which is usually independent of the temperature, T;

DC (T)=an average of DC angle error, which is a function of the temperature, T;
$H_{nA}$(T)=an amplitude of an nth-harmonic component of the error, which is a function of the temperature, T; and
$H_{nP}$=a phase of the nth-harmonic component, which is a function of the temperature, T.

Other factors described above, other than temperature, which affect the angle error, are not taken into account in equation 1. Namely, the rate of sequencing around the CVH sensing element 302 is not taken into account, the peak amplitude of the magnetic field experienced by the CVH sensing element 302 and generated by the magnet 320 is not taken into account, and the current spinning phase sequence generated by the current spinning sequence selection module 119 is not taken into account in the above expression.

An estimated and quantized angle error (rather than non-quantized error of equation (1)) can be mathematically expressed as:

$$\alpha'_{err} = OFF + DC_q(T) + \sum_{n=1}^{\infty} H_{nA\_q}(T) \cdot \sin(n\alpha + H_{nP\_q}(T)) \qquad (2)$$

where:
q stands for quantized values.

Yet another way to consider the undesirable offset voltage is given in an equation below:

$$V_1 = \frac{\sqrt{2}\,\pi}{N^{3/2}} \sigma_V \qquad (3)$$

where:
$\sigma_v$=standard deviation (i.e., variation) of offset voltages for sequentially selected vertical Hall elements, whether taken alone or in combinations by techniques described below;
N=number of vertical Hall elements, whether taken alone or in combinations, sampled in a sequence around a plurality of vertical Hall elements; and
$V_1$=magnitude of first harmonic of offset error vector in the signals 308a or 310a of FIG. 3.

From equation (3) it should be apparent that making a variation of offset voltages smaller among a plurality of vertical Hall elements sampled in sequence by techniques described below, tends to make a magnitude of a resulting first harmonic offset error vector smaller. The first harmonic of the offset error vector still adds to the desired magnetic field direction measurement, but results in less error in the magnetic field direction measurement.

FIGS. 6-16 below describe various ways in which individual vertical Hall elements within a CVH sensing element, e.g., the CVH sensing element 302 of FIG. 3, can be combined to result in lower offset voltage from any one of the combinations of vertical Hall elements and also a lower offset voltage variation as the CVH sensing element is sequenced to different vertical Hall elements, e.g., a lower variation of the signal 202 of FIG. 2. In other words, offset variation as the magnetic field sensor 300 sequences around the CVH sensing element 302 is reduced, resulting in a higher accuracy indication of a true direction of a magnetic field as reported in the x-y angle signal 314a of FIG. 3.

Figure 6:
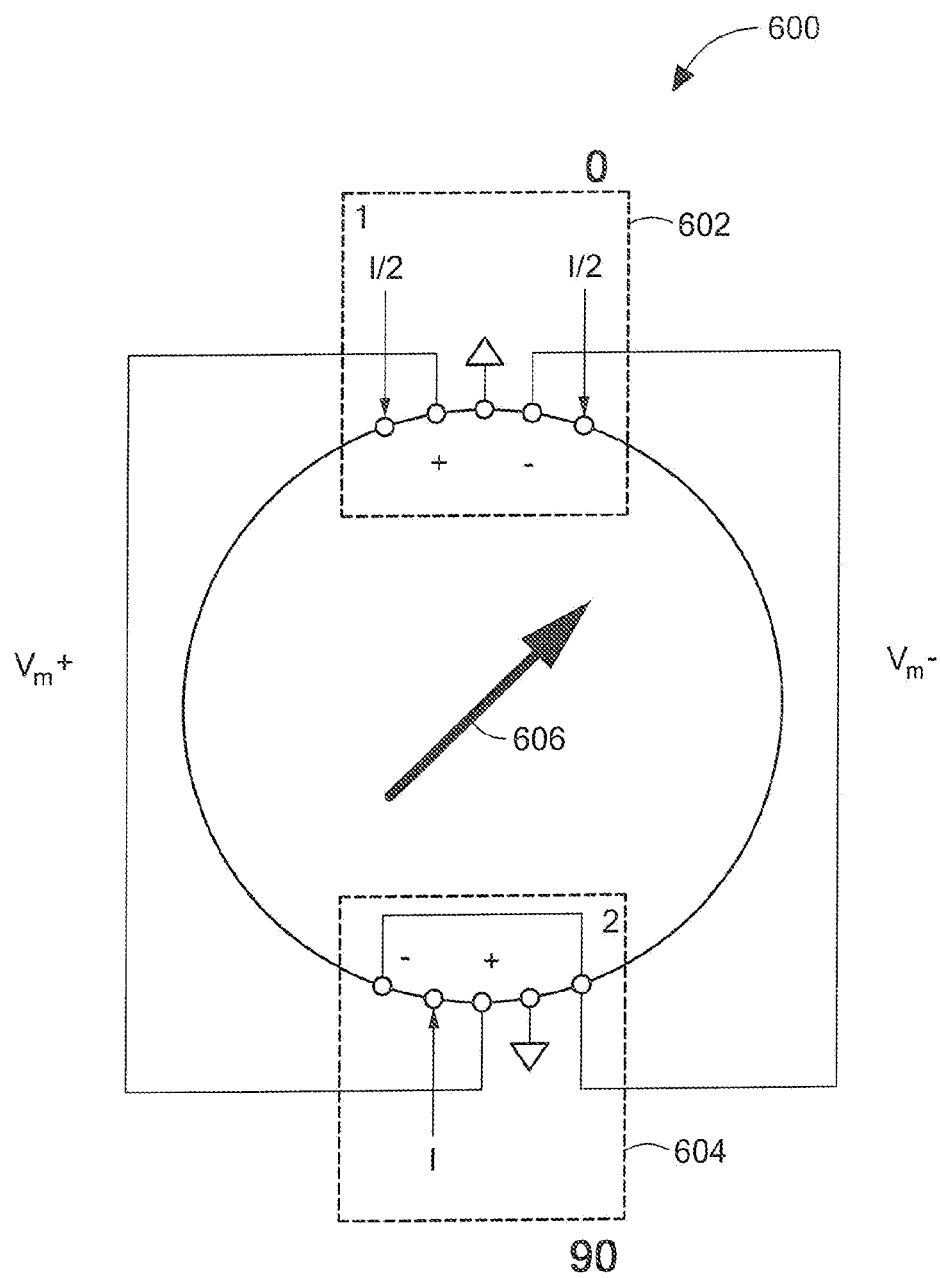
FIG. 6 is a block diagram showing an exemplary coupling of two vertical Hall elements arranged in a circle.

Referring now to FIG. 6, a coupling arrangement 600 of two vertical Hall elements 602, 604 is shown.

A first vertical Hall element 602 is arranged in a zero degree phase arrangement of FIG. 4, and a second vertical Hall element 604 is arranged in a ninety degree phase arrangement of FIG. 4B. The first and second vertical Hall elements are coupled together constructively.

The terms "constructively" and "destructively" are used herein to refer to addition or subtraction, respectively of magnetic field component of signals.

In some embodiments, the two vertical Hall elements 602, 604, are vertical Hall elements within a CVH sensing element, for example, within the CVH sensing element 12 of FIG. 1 or the CVH sensing element 302 of FIG. 3. In other embodiments, the two vertical Hall element 602, 604 are separately isolated vertical Hall elements, as may be represented by the arrangement of FIG. 1A.

Signs (+, −) used herein are representative of polarities of magnetic field components of output signals, here from the two vertical Hall elements 602, 604 in response to a magnetic field pointed in a direction of an arrow 606. It will be understood that the output signal from an individual vertical Hall element can be a differential signal, wherein one output contact is plus and the other output contact is minus according to the above convention. For a magnetic field in a direction opposite from the arrow 606, the signs of each vertical Hall element reverse.

In response to an exemplary static, i.e., not moving, magnetic field, e.g., 606, output signals from the two vertical Hall elements 602, 604 are DC signals. In response to a moving or rotating magnetic field, output signals from the two vertical Hall elements 602, 604 are changing signals that having a changing AC component. In either case, output signals from the two vertical Hall element 602, 604 each include two components, a desirable external magnetic field component (e.g., Vext, either DC or AC) responsive to the external magnetic field (static or rotating) and an offset component (e.g., Voff), which is always a DC component. The offset voltage DC component changes sign depending upon the connection phase (see, e.g., FIGS. 4-4C) of the vertical Hall element.

In response to the exemplary static magnetic field 606, a differential output signal (across + and − contacts) from the first vertical Hall element 602 is a combination of a first external magnetic field component and a first offset component, Vext1+Voff1. A differential output signal (across + and − contacts) from the second vertical Hall element 604 is a combination of a second external magnetic field component and a second offset component, Vext2−Voff2. Combining the two output signals from the two vertical Hall elements 602, 604 by coupling them together constructively as shown results in a combined differential signal:

$$Vm+, Vm-= [(Vext1 + Voff1) + (Vext2 - Voff2)]/2$$
$$= (Vext1 + Vext2)/2 + (Voff1 - Voff2)/2.$$

Assuming that Voff1 approximately equals Voff2, and assuming that Vext1 approximately equals Vext2, the resulting external magnetic field component of the combined differential signal Vm+, Vm− is approximately Vext, and the offset voltage in the combined signal is approximately canceled to zero. However, because Voff1 does not exactly equal Voff2, a residual small offset, Voffresa, remains.

Factors of two in the above equations and in following equations are the result of each one of the two vertical Hall elements behaving like a respective voltage source in series with a resistance. When coupled together, two vertical Hall elements tend to provide an output signal that is an average of the two output signals.

Thus, the two vertical Hall element 602, 604 can be coupled as shown, with the connection phases zero and ninety as shown, such that the external magnetic field components add constructively, and such that the offset components approximately cancel.

From FIGS. 2 and 5, it will be appreciated that a lower DC offset voltage for each sequentially selected vertical Hall element ultimately results in a more accurate x-y angle signal generated by a magnetic field sensor, e.g., a more accurate x-y angle signal 314a generated by the magnetic field sensor 300 of FIG. 3.

The couplings shown among the two vertical Hall elements can be accomplished, for example, by way of the sequence switches circuit 304 of FIG. 3 and the current switched circuit 306 of FIG. 3.

In some embodiments, the two vertical Hall elements 602, 604 (and also vertical Hall elements below in conjunction with other figures) are chopped or current spun. In other embodiments, there is no chopping or current spinning.

While the vertical Hall element 602, 604 are shown to be statically coupled in a particular arrangement, for embodiments in which chopping or current spinning is employed, the two vertical Hall elements 602, 604 need only remain ninety degrees apart in the coupling phases as the current spinning progresses. As described above, the degree names given to the coupling arrangements are somewhat arbitrary for a vertical Hall element, and are derived from coupling arrangements of a planar Hall element. Thus, the coupling shown in FIG. 6 can be representative of a first chopping arrangement in four phase chopping. For a second chopping arrangement, the vertical Hall element 602 can be arranged in a ninety degree coupling arrangement in accordance with FIG. 4B, and the vertical Hall element 604 can be arranged in a one hundred eighty degree coupling arrangement in accordance with FIG. 4A. For a third chopping arrangement, the vertical Hall element 602 can be arranged in a one hundred eighty degree coupling arrangement in accordance with FIG. 4A, and the vertical Hall element 604 can be arranged in a two hundred seventy degree coupling arrangement in accordance with FIG. 4C. For a fourth chopping arrangement of vertical Hall element 602 can be arranged in a two hundred seventy degree coupling arrangement in accordance with FIG. 4C, and the vertical Hall element 604 can be arranged in a zero degree coupling arrangement in accordance of FIG. 4. For all of the chopping arrangements, signal output contacts of the vertical Hall elements 602, 604 are coupled together such that a magnetic field components of signals on the signal output contacts add constructively, and offset components of the signals on the signal output contacts cancel each other.

The above chopping or current spinning can be achieved, for example, by way of the sequence switches circuit 304 and the current switches circuit 306 of FIG. 3.

For embodiments in which there is no chopping or current spinning, once an output sample is achieved by the arrangement shown in FIG. 6, the sequence switches circuit 304 and the current switches circuit 306 merely stepped to a next vertical Hall element, which can be a rotation to the right or a rotation to the left in FIG. 6. For embodiments in which the two vertical Hall element 602, 604 are members of a set of vertical Hall elements within a CVH sensing element, the shift to the right or the left can be by one or more contacts of the CVH sensing element.

Other arrangements of combinations of vertical Hall elements are described in figures below. Chopping or current spinning is not described in conjunction with each one of these figures, but it will be understood that each one of the arrangements shown in figures below can be used with chopping or current spinning, maintaining the indicated relative phase differences of current spinning arrangements per FIGS. 4-4C for each step in the current spinning sequence, maintaining coupling of output signal contacts according to the polarities shown in each figure, and maintaining physical angular relationships between vertical Hall elements at each sequence step.

Figure 7:
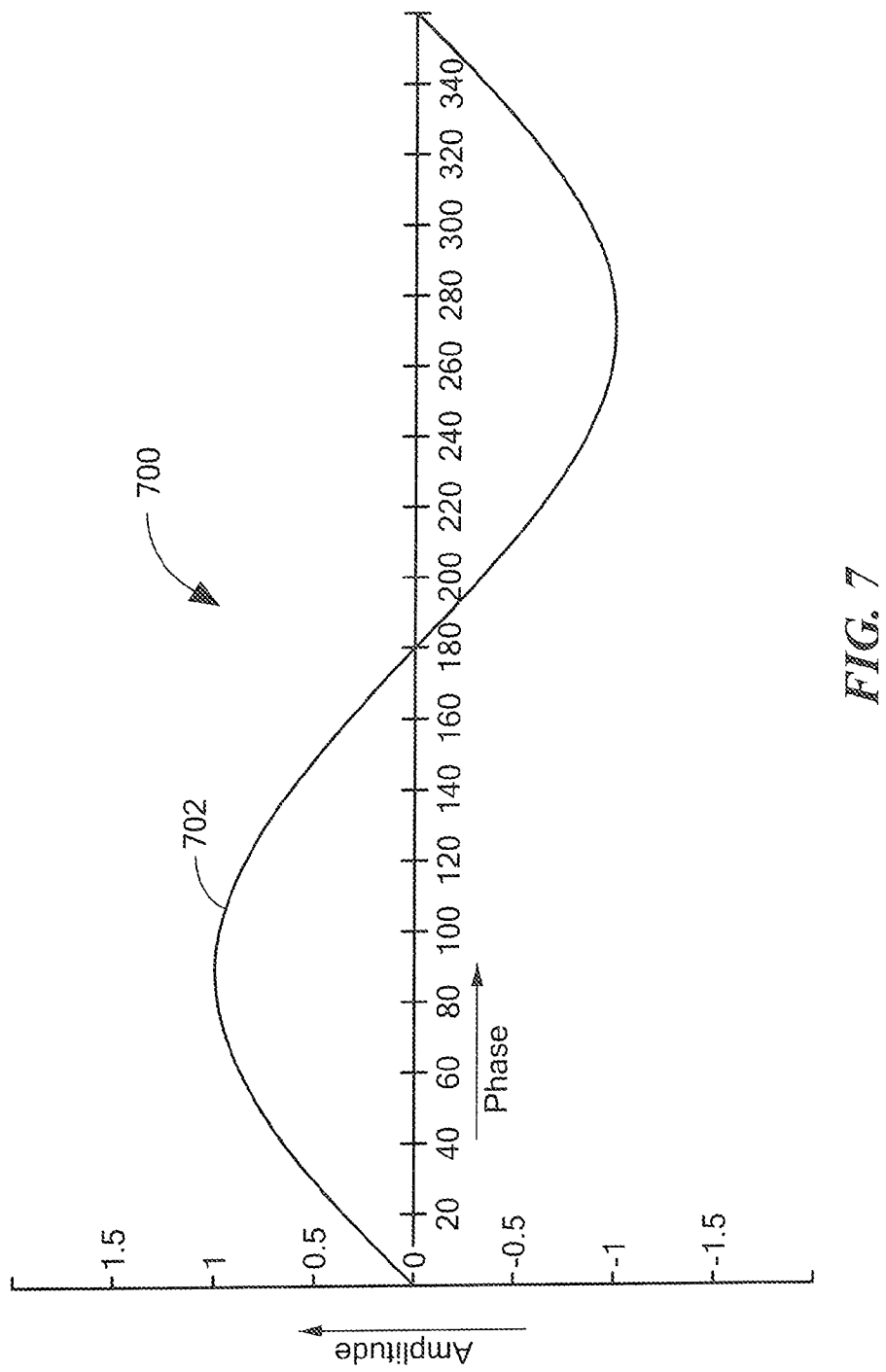
FIG. 7 is a graph showing an electrical characteristic of the two vertical Hall elements of FIG. 6.

Referring now to FIG. 7, a graph 700 has a horizontal axis with a scale in units of phase in degrees. The graph 700 also has a vertical scale with units in amplitude in normalized units.

A curve 702 is representative of a first harmonic the above-described residual offset, Voffresa, in a sequentially sampled and filtered output signal (e.g., signal 310a of FIG. 3), for one full revolution of selected vertical Hall elements around a circle, where the selected vertical Hall elements are ninety degrees apart in coupling phases (602, 604, FIG. 6) and are combined as represented by the two statically selected vertical Hall elements 602, 604 of FIG. 6. The curve 702 essentially represents an error signal resulting only from offset voltages, which, in operation, adds to a sequential signal resulting from an external magnetic field, resulting in a phase error in the observed sequential signal. The error signal 702 by itself can be observed, for example, by placing the magnetic field sensor 300 of FIG. 3 in a zero external magnetic field, with vertical Hall elements coupled as represented in FIG. 6, and observing the signal 310a of FIG. 3. In the presence of a zero external magnetic field the signal 310a should be zero, but instead it can be an error signal as represented by the current 702.

A phase of the error signals 702 is arbitrarily shown to be zero degrees. It has been observed that, typically, a magnitude of the error signal 702 is similar to that which would be achieved instead with an external magnetic field of 7.5 Gauss but without an offset component. For an external field of one thousand Gauss, the error component equivalent to 7.5 Gauss results in a maximum or peak error in the x-y angle signal 314a of FIG. 3 of about 0.43 degrees. This error can be calculated by simple vector addition taking a static error vector according to 7.5 Gauss at any one selected phase angle, and adding that error vector to a rotating external magnetic field vector according to 1000 Gauss resulting from a rotating magnetic field proximate to the arrangement of FIG. 6.

If the coupling arrangement of FIG. 6 were not used, but instead an output signal from only one vertical Hall element at a time during the sequence around the circle were used, the error signal would typically be much larger and a resulting angle error in the x-y angle signal 314a of FIG. 3 would typically be much larger.

Figure 8:
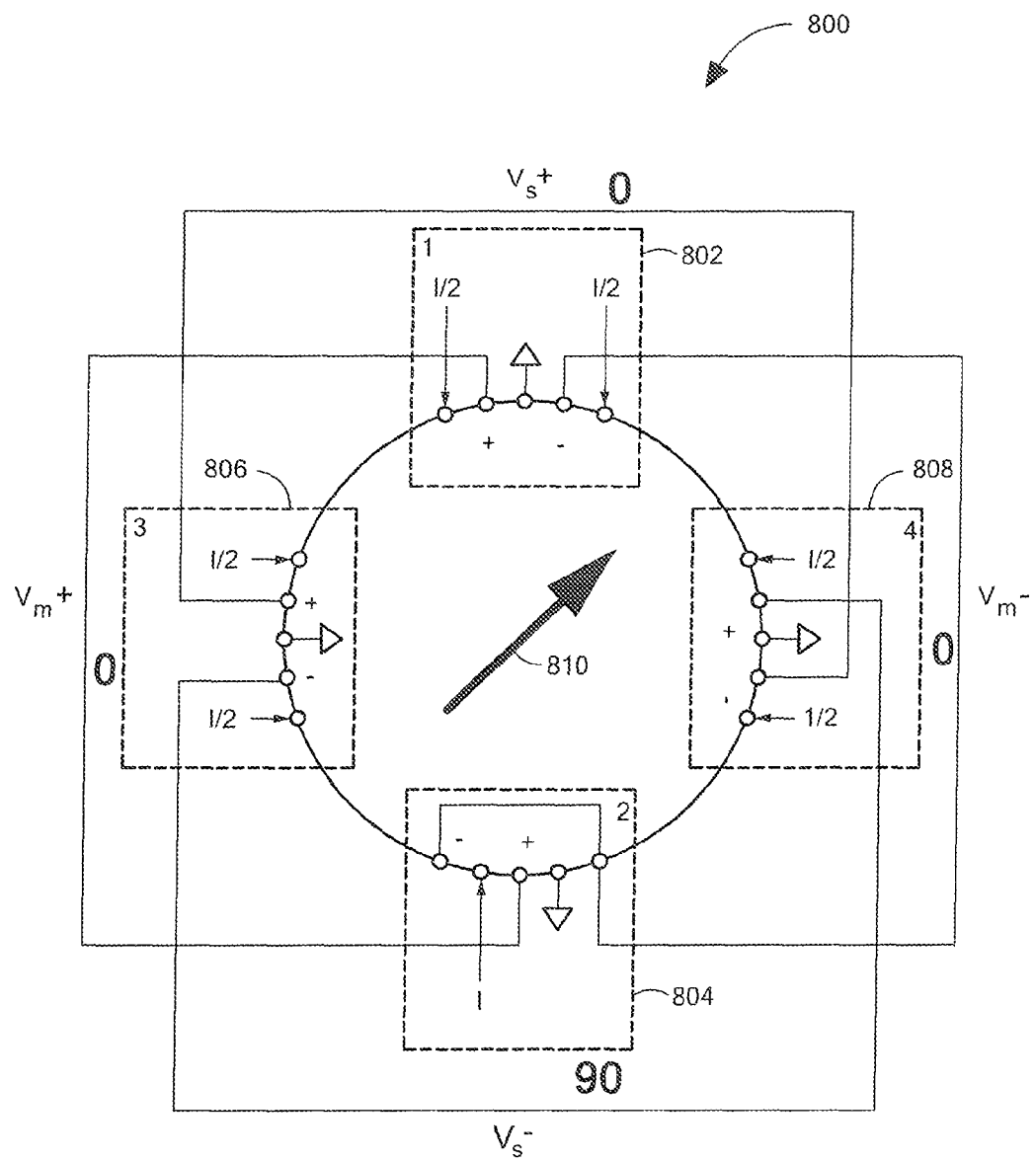
FIG. 8 is a block diagram showing an exemplary coupling of four vertical Hall elements arranged in a circle.

Referring now to FIG. 8, another coupling arrangement 800 is shown.

A first vertical Hall element 802 is arranged in a zero degree phase arrangement of FIG. 4, a second vertical Hall element 804 is arranged in a ninety degree phase arrangement of FIG. 4B, a third vertical hall element 806 is arranged in a zero degree phase arrangement of FIG. 4, and a fourth vertical Hall element 808 is arranged in a zero degree phase arrangement of FIG. 4.

The couplings shown among the four vertical Hall elements can be accomplished, for example, by way of the sequence switches circuit 304 of FIG. 3 and the current switched circuit 306 of FIG. 3.

In some embodiments, the four vertical Hall elements 802, 804, 806, 808, are vertical Hall elements within a CVH sensing element, for example, within the CVH sensing element 12 of FIG. 1 or the CVH sensing element 302 of FIG. 3. In other embodiments, the four vertical Hall elements 802, 804, 806, 808 are separately isolated vertical Hall elements, as may be represented by the arrangement of FIG. 1A.

The first and second vertical Hall elements 802, 804 are coupled together constructively in the same way as the vertical Hall element 602, 604 of FIG. 6. Thus, in response to an exemplary static magnetic field 810, a differential output signal (across + and − contacts) from the first vertical Hall element 802 is a combination of a first external magnetic field component and a first offset component, Vext1+Voff1. A differential output signal (across + and − contacts) from the second vertical Hall element 804 is a combination of a second external magnetic field component and a second offset component, Vext2−Voff2. Combining the two output signals from the two vertical Hall elements 802, 804 by coupling them together constructively as shown results in a combined differential signal:

$$Vm+, Vm- = [(Vext1 + Voff1) + (Vext2 - Voff2)]/2$$

$$= (Vext1 + Vext2)/2 + (Voff1 - Voff2)/2.$$

As with FIG. 6 above, assuming that Voff1 approximately equals Voff2, and assuming that Vext1 approximately equals Vext 2, the resulting external magnetic field component of the combined differential signal Vm+, Vm− is approximately Vext, and the offset voltage in the combined signal is approximately canceled to zero. However, because Voff1 does not exactly equal Voff2, a residual small offset, Voffresa, remains.

The third and fourth vertical Hall elements 806, 808 each have a phase arrangement of zero degrees according to the arrangement of FIG. 4. As indicated by output signals polarities (+, −) output signal contacts of the vertical Hall elements 806, 808 are coupled such that the magnetic field signal components of the output signals add destructively.

The first and second vertical Hall elements 802, 804 physically arranged one hundred and eighty degrees apart around a circle of vertical Hall elements, e.g., around a circular vertical Hall element, or around a circle of separately isolated vertical Hall elements. The third and fourth vertical Hall elements 806, 808 are also physically arranged one hundred and eighty degrees apart around the circle of vertical Hall elements.

A line between the third and fourth vertical Hall elements 806, 808 is ninety from a line between the first and second vertical Hall elements 802, 804. Other physical arrangements are also possible, some of which are described herein.

In response to an exemplary static magnetic field 810, a differential output signal (across + and − contacts) from the third vertical Hall element 806 is a combination of a third external magnetic field component and a third offset component, −Vext3−Voff3. A differential output signal (across + and − contacts) from the fourth vertical Hall element 808 is a combination of a fourth external magnetic field component and a fourth offset component, Vext4+Voff4. Combining the two output signals from the two vertical Hall elements 806, 808 by coupling them together destructively as shown results in a combined differential signal:

$$Vs+, Vs- = [(-Vext3 - Voff3) + (Vext4 + Voff4)]/2$$
$$= (Vext4 - Vext3)/2 + (Voff4 - Voff3)/2.$$

Assuming that Voff3 approximately equals Voff4, and assuming that Vext3 approximately equals Vext4, the resulting external magnetic field component of the combined differential signal Vs+, Vs− is approximately zero, and the offset voltage cancels to approximately zero. However, again a small residual offset voltage, Voffresb, remains.

In conjunction with FIG. 9 below, it is described that the residual offset voltage, Voffresa, dynamically generated by the combination of the first and second vertical Hall elements 802, 804, respectively, as the vertical Hall elements are sequenced around the circle of vertical Hall elements can have a similar magnitude but a different phase than the residual offset voltage, Voffresb, generated by the combination of the third and fourth vertical Hall elements 806, 808, respectively. It will be described that Voffresa and Voffresb can cancel each other, or can nearly cancel each other, by combining signals generated by the two pair of vertical Hall elements.

The differential signal Vm+, Vm− from the first and second vertical Hall elements 802, 804, respectively, can be combined with the differential signal Vs+, Vs− from the third and fourth vertical Hall elements 806, 808 respectively, for example, by the differential amplifier 308 of FIG. 3. The result of such combination is described more fully below in conjunction with FIG. 9.

Sequencing or stepping around a circle of vertical Hall elements and chopping or current spinning of the vertical Hall elements can be the same as or similar to that described above in conjunction with FIG. 6. The vertical Hall elements 802, 804, 806, 808 can be arranged as a circular vertical Hall element (CVH) as described above in conjunction with FIG. 1, or as a circularly arranged set of separately isolated vertical Hall elements as represented in FIG. 1A.

Figure 9:
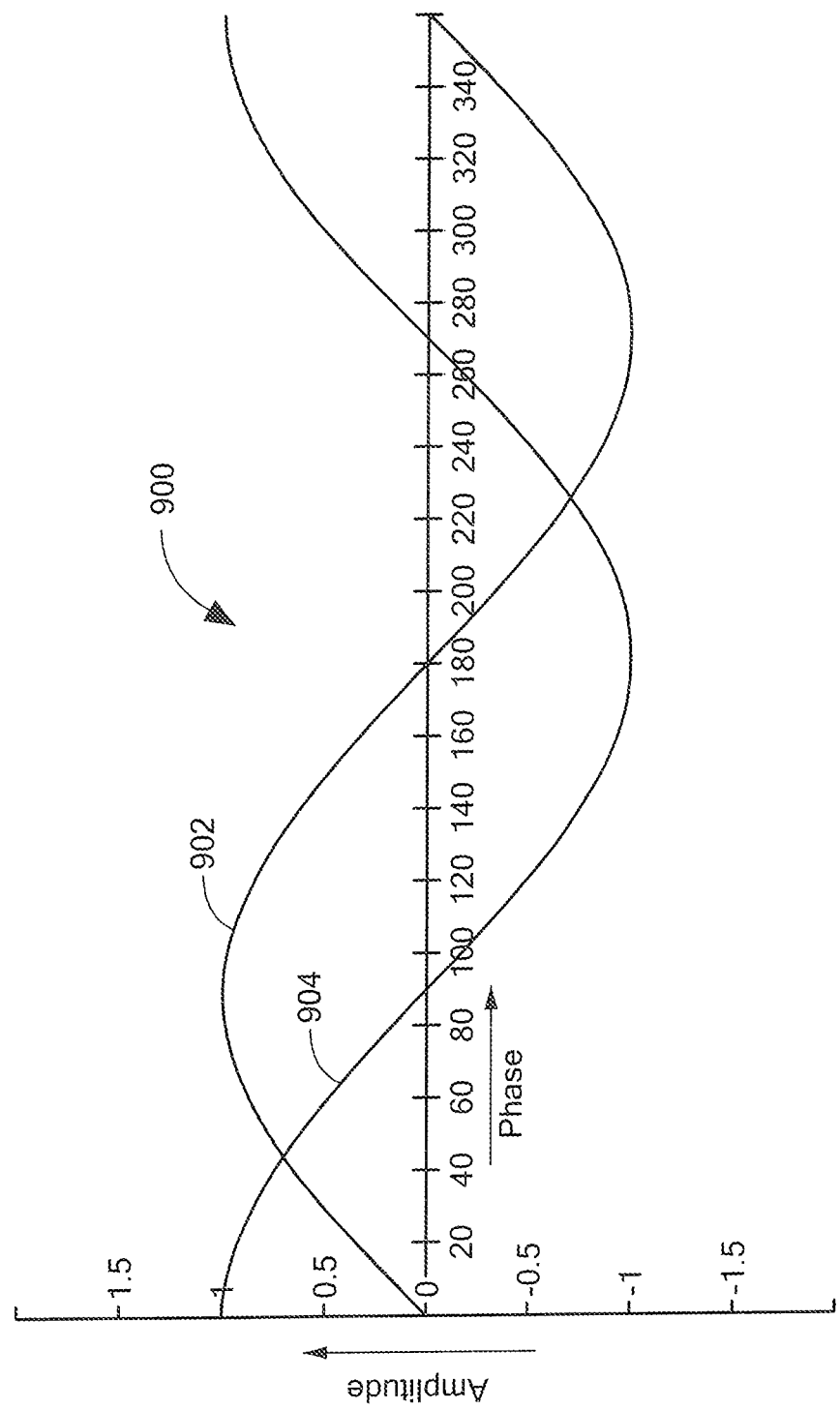
FIG. 9 is a graph showing an electrical characteristic of the four vertical Hall elements of FIG. 8.

Referring now to FIG. 9, a graph 900 has a horizontal axis with a scale in units of phase in degrees. The graph 900 also has a vertical scale with units in amplitude in normalized units.

A curve 902, like the curve 702 of FIG. 7, is representative of a first harmonic the above-described residual offset, Voffresa, in a sequentially sampled and filtered output signal (e.g., signal 310a of FIG. 3) for one full revolution of selected vertical Hall elements around a circle, where the selected vertical Hall elements are ninety degrees apart in coupling phases as represented by the vertical Hall elements 802, 804 of FIG. 3.

A curve 904 is representative of a first harmonic the above-described residual offset, Voffresb, in a sequentially sampled and filtered output signal (e.g., signal 310a of FIG. 3) for one full revolution of selected vertical Hall elements around a circle, where the selected vertical Hall elements are each at zero degrees coupling phases as represented by the vertical Hall elements 806, 808 of FIG. 8.

The curves 902, 904 can be about ninety degrees apart, which is determined by the ninety degree relative position of the vertical Hall elements 802, 804 relative to the vertical Hall elements 806, 808. In order to best combine the curves 902, 904, i.e., signals 902, 904, it is advantageous to phase shift one of or both of the signals 902, 904 so that the signals 902, 904 are one hundred eight degrees out of phase where the signals 902, 904 are added, or to phase shift one or both of the signals 902, 904 so that the signals 902, 904 are in phase where the signals 902, 904 are subtracted. To this end, the phase adjustment module 307 of FIG. 3 applies a phase adjustment to one of the differential signals provided by the sequence switches circuit 304.

In other embodiments, relative position of the vertical Hall elements 802, 804 relative to the vertical Hall elements 806, 808 is an angle other than ninety degrees, and the phase difference between the curves 902, 904 is other than ninety degrees accordingly. One such arrangement is shown below in conjunction with FIG. 10.

Figure 10:
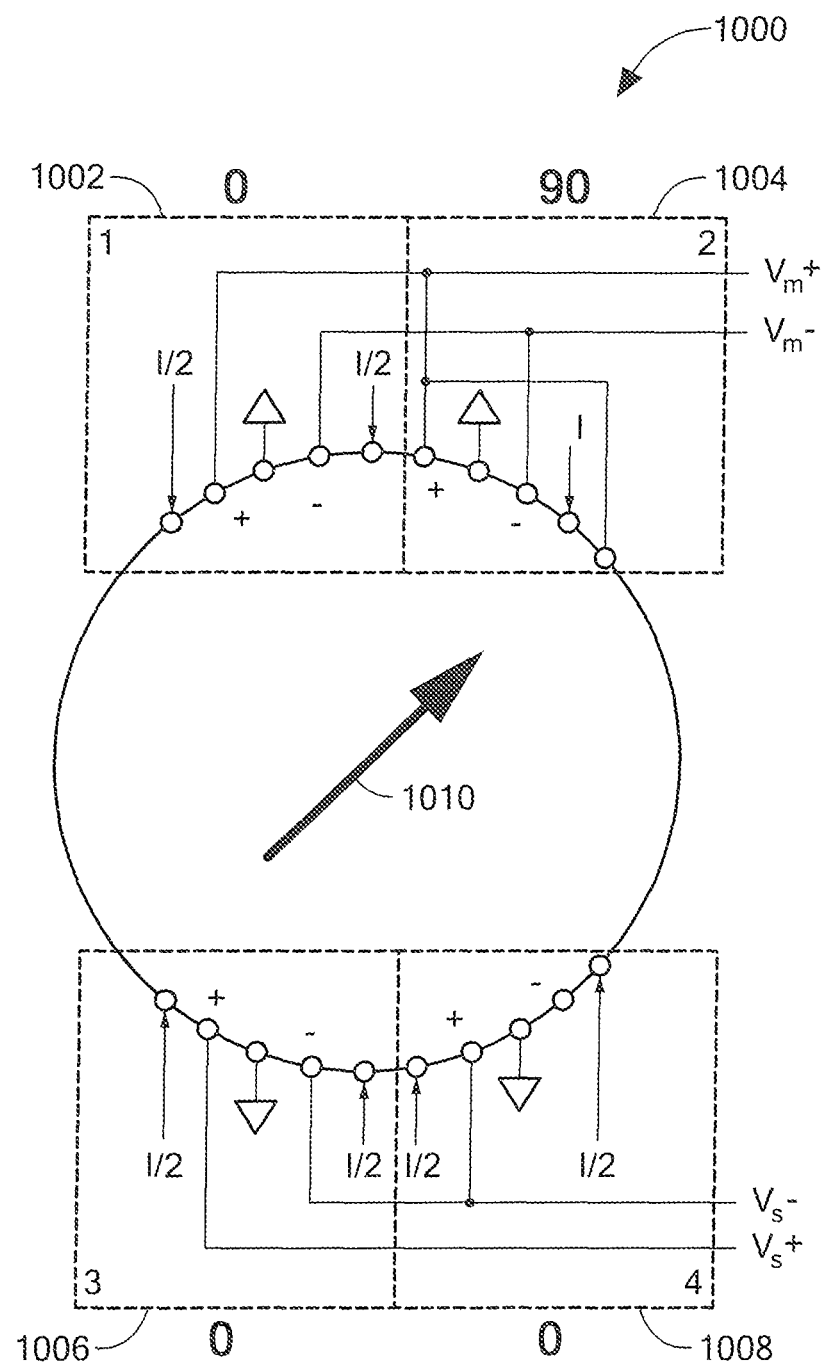
FIG. 10 is a block diagram showing another exemplary coupling of four vertical Hall elements arranged in a circle.

Referring now to FIG. 10, another coupling arrangement 1000 is shown.

A first vertical Hall element 1002 is arranged in a zero degree phase arrangement of FIG. 4, a second vertical Hall element 1004 is arranged in a ninety degree phase arrangement of FIG. 4B, a third vertical Hall element 1006 is arranged in a zero degree phase arrangement of FIG. 4, and a fourth vertical Hall element 1008 is arranged in a zero degree phase arrangement of FIG. 4.

The couplings shown among the four vertical Hall elements can be accomplished, for example, by way of the sequence switches circuit 304 of FIG. 3 and the current switched circuit 306 of FIG. 3.

In some embodiments, the four vertical Hall elements 1002, 1004, 1006, 1008 are vertical Hall elements within a CVH sensing element, for example, within the CVH sensing element 12 of FIG. 1 or the CVH sensing element 302 of FIG. 3. In other embodiments, the four vertical Hall elements 1002, 1004, 1006, 1008 are separately isolated vertical Hall elements, as may be represented by the arrangement of FIG. 1A.

The first and second vertical Hall elements 1002, 1004 are coupled together constructively in the same way as the first and second vertical Hall element 802, 804 of FIG. 8. The third and fourth vertical Hall elements 1006, 1008 are coupled together destructively in the same way as the third and fourth vertical Hall element 806, 808 of FIG. 8. However, unlike the coupling arrangement 800 of FIG. 8, the first and second vertical Hall elements 1002, 1004 are physically arranged next to each other, and the third and fourth vertical Hall elements 1006, 1008 are also physically arranged next to each other.

The first vertical Hall element 1002 is disposed one hundred eighty degrees around a circle of vertical Hall elements from the fourth vertical Hall element 1008. The second vertical Hall element 1004 is disposed one hundred eighty degrees around the circle of vertical Hall elements from the third vertical Hall element 1006.

As described more fully above in conjunction with vertical Hall element 602, 604 of FIG. 6, magnetic field signal components of the output signals of the vertical Hall elements 1002, 1004 add constructively, and offset components of the output signals of the vertical Hall elements 1002, 1004 approximately cancel to zero, but there may remain a residual offset voltage Voffresa.

The third and fourth vertical Hall elements 1006, 1008 each have a phase arrangement of zero degrees according to the arrangement of FIG. 4. As indicated by output signals polarities (+, −) output signal contacts of the vertical Hall elements 1006, 1008 are coupled such that the magnetic field signal components of the output signals add destructively.

A line between the first and fourth vertical Hall elements 1002, 1008 is rotated less than ninety degrees, e.g., twenty degrees, from a line between the second and third vertical Hall elements 1004, 1006. Other physical arrangements are also possible, some of which are described herein.

In response to an exemplary static magnetic field 1010, differential output signal (across + and − contacts) from the first vertical Hall element 1002 is a combination of a first external magnetic field component and a first offset component, Vext1+Voff1. A differential output signal (across + and − contacts) from the second vertical Hall element 1004 is a combination of a second external magnetic field component and a second offset component, Vext2−Voff2. Combining the two output signals from the two vertical Hall elements 1002, 1004 by coupling them together constructively as shown results in a combined differential signal:

$$Vm+, Vm- = [(Vext1 + Voff1) + (Vext2 - Voff2)]/2$$
$$= (Vext1 + Vext2)/2 + (Voff1 - Voff2)/2.$$

Assuming that Voff1 approximately equals Voff2, and assuming that Vext1 approximately equals Vext2, the resulting external magnetic field component of the combined differential signal Vm+, Vm− is approximately Vext, and the offset voltage in the combined signal is approximately canceled to zero. However, because Voff1 does not exactly equal Voff2, a residual small offset, Voffresa, remains.

Thus, the two vertical Hall elements 1002, 1004 can be coupled as shown, with the connection phases zero and ninety as shown, such that the external magnetic field components add constructively, and such that the offset components approximately cancel.

A differential output signal (across + and − contacts) from the third vertical Hall element 1006 is a combination of a third external magnetic field component and a third offset component, Vext3+Voff3. A differential output signal (across + and − contacts) from the fourth vertical Hall element 1008 is a combination of a fourth external magnetic field component and a fourth offset component, −Vext4−Voff4. Combining the two output signals from the two vertical Hall elements 806, 808 by coupling them together destructively as shown results in a combined differential signal:

$$Vs+, Vs- = [(Vext3 + Voff3) + (-Vext4 - Voff4)]/2$$
$$= (Vext3 - Vext4)/2 + (Voff3 - Voff4)/2.$$

Assuming that Voff3 approximately equals Voff4, and assuming that Vext3 approximately equals Vext4, the resulting external magnetic field component of the combined differential signal Vs+, Vs− is approximately zero, and the offset voltage cancels to approximately zero. However, again a small residual offset voltage, Voffresb, remains.

Like that depicted in FIG. 9, the residual offset voltage, Voffresa, dynamically generated by the combination of the first and second vertical Hall elements 1002, 1004, respectively, as the vertical Hall elements are sequenced around the circle of vertical Hall elements can have a similar magnitude but a different phase than the residual offset voltage, Voffresb, generated by the combination of the third and fourth vertical Hall elements 1006, 1008, respectively.

The signals Voffresa, Voffresb can be brought into phase alignment by the phase adjustment processor 307 of FIG. 3.

The differential signal Vm+, Vm− from the first and second vertical Hall elements 1002, 1004, respectively, can be combined with the differential signal Vs+, Vs− from the third and fourth vertical Hall elements 1006, 1008, respectively, with or without phase adjustment, for example, by the differential amplifier 308 of FIG. 3. The result of such combination is described more fully above in conjunction with FIG. 9.

Sequencing or stepping around a circle of vertical Hall elements and chopping or current spinning of the vertical Hall elements can be the same as or similar to that described above in conjunction with FIG. 6. The vertical Hall elements 1002, 1004, 1006, 1008 can be arranged as a circular vertical Hall element (CVH) as described above in conjunction with FIG. 1, or as a circularly arranged set of separately isolated vertical Hall elements as represented in FIG. 1A.

Figure 11:
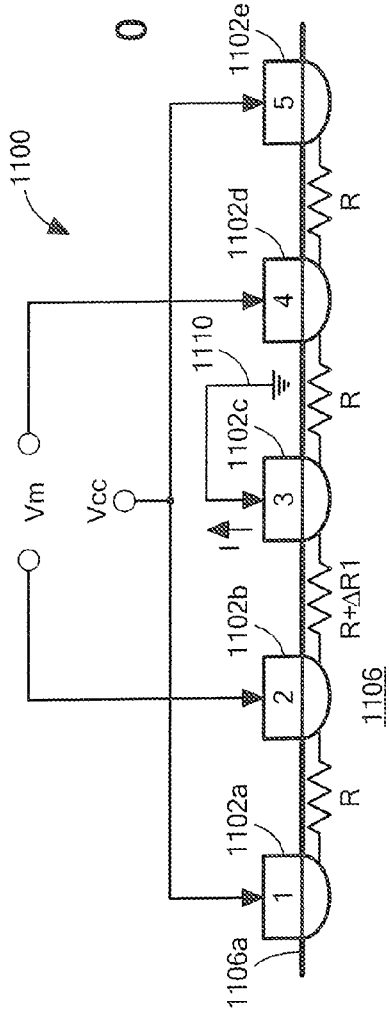
FIG. 11 is a block diagram showing five contacts of a vertical Hall element coupled in the first phase configuration and showing resistances between the contacts.

Referring now to FIG. 11, contacts 1102a-1102e (also 1-5) of a five contact vertical Hall element 1100 are arranged in the zero degree coupling of FIG. 4. The vertical Hall element 1100 is intended to represent the vertical Hall element 802 of FIG. 8, or the vertical Hall element 1002 of FIG. 10. Resistances between the contacts 1102a-1102e and within a substrate 1106 are shown. In order to represent an offset voltage generated by the vertical Hall element 1100, resistances, R, between most of the contacts are made the same, but a resistance, R+ΔR1 is shown between contacts numbered two and three.

An electronic circuit representation of the vertical Hall element 1100 is shown below in conjunction with FIG. 13.

Figure 12:
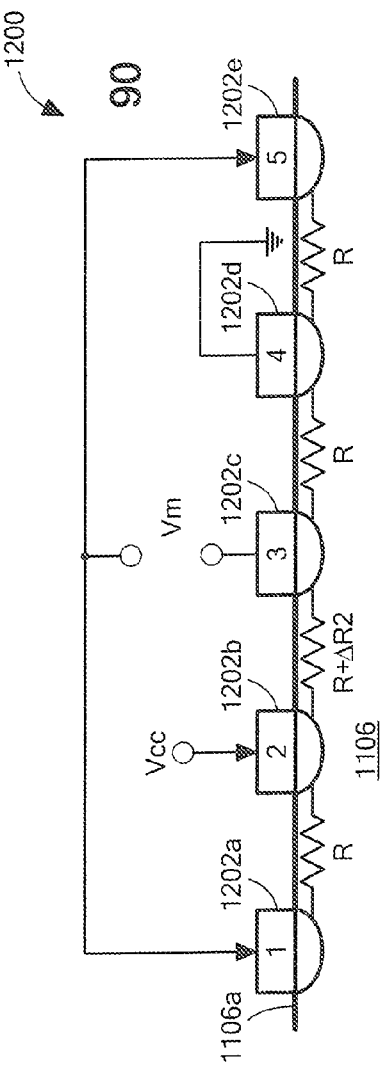
FIG. 12 is another block diagram showing five contacts of a vertical Hall element coupled in a second different phase configuration and showing resistances between the contacts.

Referring now to FIG. 12, in which like elements of FIG. 11 are shown having like reference designations, contacts 1202a-1202e (also 1-5) of a five contact vertical Hall element 1200 are arranged in the ninety degree coupling of FIG. 4B. The vertical Hall element 1200 is intended to represent the vertical Hall element 804 of FIG. 8, or the vertical Hall elements 1004 of FIG. 10. Resistances between the contacts 1102a-1102e and within the substrate 1106 are shown. In order to represent an offset voltage generated by the vertical Hall element 1200, resistances, R, between most of the contacts are made the same, but a resistance, R+ΔR2 is shown between contacts numbered two and three.

An electronic circuit representation of the vertical Hall element 1100 is shown below in conjunction with FIG. 13.

Figure 13:
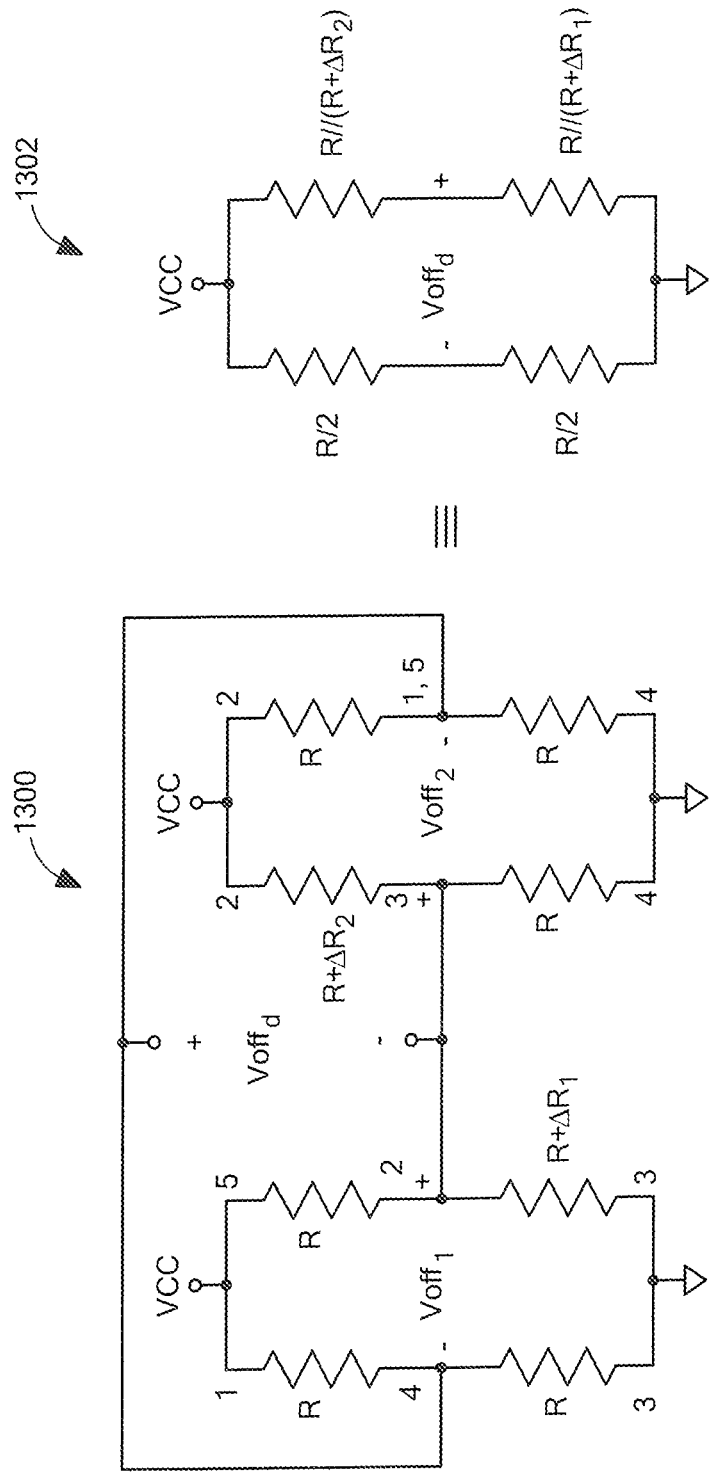
FIG. 13 is an electrical schematic showing equivalent circuits of the vertical Hall elements of FIGS. 11 and 12 when coupled in the arrangement of FIG. 6.

Referring now to FIG. 13, a circuit model 1300 is representative of two vertical Hall elements coupled together. A circuit model portion on the left of the circuit model 1300 is representative of the vertical Hall element 1100 of FIG. 11 (i.e., zero phase coupling of FIGS. 4 and 11, i.e., first vertical Hall elements 802, 1002 of FIGS. 8 and 10, respectively). A circuit model portion on the right of the circuit model 1300 is representative of the vertical Hall element 1200 of FIG. 12 (i.e., ninety phase coupling of FIGS. 4B and 12, i.e., second vertical Hall elements 804, 1004 of FIGS. 8 and 10, respectively).

Contacts of the two electrical couplings are indicated by numbers one through five. Resistances R, R+ΔR1, and R+ΔR2 are shown between contacts according to the vertical Hall elements of FIGS. 11 and 12. The two circuit models are coupled together constructively in the same way that vertical Hall elements 802, 804 of FIG. 8 and vertical Hall elements 1002, 1004 of FIG. 10 are coupled together.

A circuit model 1302 is equivalent to the circuit model 1300.

A symbol // is intended to represent "parallel to." Equations below describe the circuit model 1302. In equations below a superscript zero is intended to be indicative of the zero phase coupling of the left hand side of the arrangement of the circuit model 1300, and a superscript 90 is intended to be indicative of the ninety phase coupling of the right hand side of the arrangement of the circuit model 1300.

Assuming that $R \gg \Delta R_i$, we can then approximate $R//(R+\Delta R)$ as $(R+\Delta R)/2$. Therefore:

$$Voff_d = V^+ \cdot \left( \frac{R + \Delta R_1^0}{2R + \Delta R_1^0 + \Delta R_2^0} - \frac{1}{2} \right) \qquad (1)$$

$$Voff_d = V^+ \cdot \frac{2R + 2\Delta R_1^0 - R - \Delta R_1^0 - R - \Delta R_2^{90}}{4R + 2\Delta R_1^0 + 2\Delta R_2^{90}}$$

$$Voff_d = V^+ \cdot \frac{\Delta R_1^0 - \Delta R_2^{90}}{4R + 2\Delta R_1^0 + 2\Delta R_2^{90}}$$

Assuming $4R \gg 2\Delta R_1 + 2\Delta R_2^{90}$ we get that $$Voff_d \sim V^+ \cdot \frac{\Delta R_1^0 - \Delta R_2^{90}}{4R} = Voff_1^0 - Voff_2^{90} \qquad (2)$$

The above equation is the residual offset, Voffresa, described above.

Figure 14:
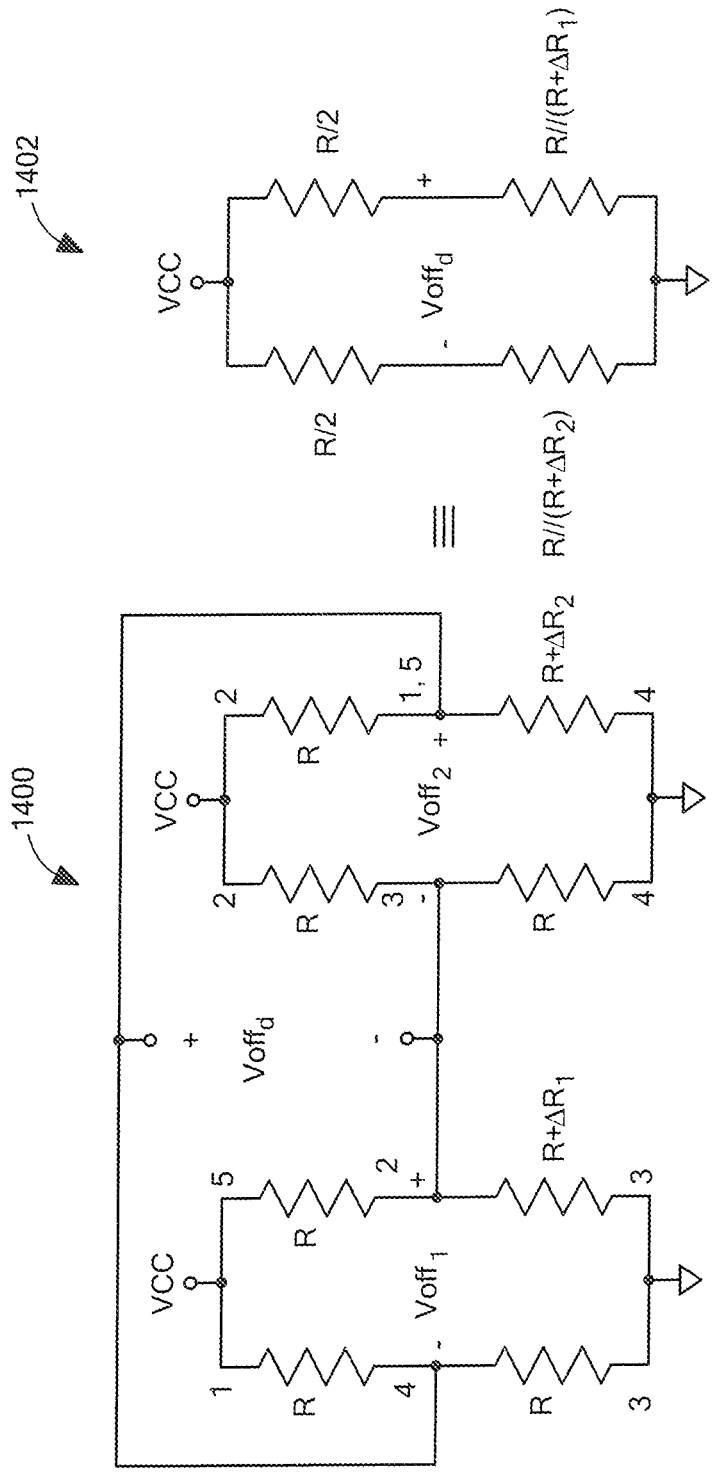
FIG. 14 is an electrical schematic showing equivalent circuits of the vertical Hall element of FIG. 12 when coupled together in an arrangement represented by a portion of FIG. 8.

Referring now to FIG. 14, a circuit model 1400 is another circuit model of two vertical Hall elements coupled together. A circuit model portion on the left of the circuit model 1400 is representative of the vertical Hall element 1100 of FIG. 11 (i.e., zero phase coupling of FIGS. 4 and 11, i.e., third vertical Hall elements 806, 1006 of FIGS. 8 and 10, respectively). A circuit model portion on the right of the circuit model 1400 is representative of the vertical Hall element 1200 of FIG. 12 (i.e., zero phase coupling of FIGS. 4 and 11, i.e., fourth vertical Hall elements 808, 1008 of FIGS. 8 and 10, respectively).

Contacts of the two electrical couplings are indicated by numbers one through five.

Resistances R, R+ΔR1, and R+ΔR2 are shown between contacts according to the vertical Hall element 1100 of FIG. 11. The two circuit models are coupled together destructively in the same way that vertical Hall elements 806, 808 of FIG. 8 and vertical Hall elements 1006, 1008 of FIG. 10 are coupled together.

A circuit model 1402 is equivalent to the circuit model 1400.

A symbol // is intended to represent "parallel to." Equations below describe the circuit model 1402. In equations below a superscript zero is intended to be indicative of the zero phase coupling of the left hand side and of the right hand side of the arrangement of the circuit model 1400. Assuming that $R \gg \Delta R_i$, we can then approximate $R//(R+\Delta R) \sim (R+\Delta R)/2$. Therefore:

$$Voff_d = V^+ \cdot \left( \frac{R + \Delta R_1^0}{2R + \Delta R_1^0} - \frac{R + \Delta R_1^0}{2R + \Delta R_2^0} \right) \qquad (3)$$

$$Voff_d = V^+ \cdot \frac{2R^0 + 2R\Delta R_1^0 + R\Delta R_2^0 + \Delta R_1^0 \Delta R_2^0 - 2R^2 - 2R\Delta R_2^0 - R\Delta R_1^0 - \Delta R_1^0 \Delta R_2^0}{4R^2 + 2R\Delta R_1^0 + 2R\Delta R_2^0 + \Delta R_2^0 \Delta R_1^0}$$

$$Voff_d = V^+ \cdot \frac{R\Delta R_1^0 - R\Delta R_2^0}{4R^2 + 2R\Delta R_1^0 + 2R\Delta R_2^0 + \Delta R_2^0 \Delta R_1^0}$$

Comparing equation (1) with equation (3) it can be observed they only differ in the $(\Delta R_2^0 \Delta R_1^0)$ factor in the denominator. In most cases this factor should be negligible and can be discarded, yielding after simplifying R:

$$Voff_d \sim V^+ \cdot \frac{\Delta R_1^0 - \Delta R_2^0}{4R + 2\Delta R_1^0 + 2\Delta R_2^0} = Voff_1^0 - Voff_2^0$$

Consequently the arrangement 1402 of FIG. 14 generates an offset vector with a high degree of matching with respect to the arrangement 1302 of FIG. 13.

$Voff_0^0 - Voff_2^0 \cong Voff_1^0 - Voff_2^{50}$

Thus, the residual offset, Voffresb, generated by the second pair of vertical Hall elements in any of the four vertical Hall element arrangements shown above (and below) can be used to further reduce or cancel the residual offset, Voffresa, that is generated by the first pair of vertical Hall elements.

Figure 15:
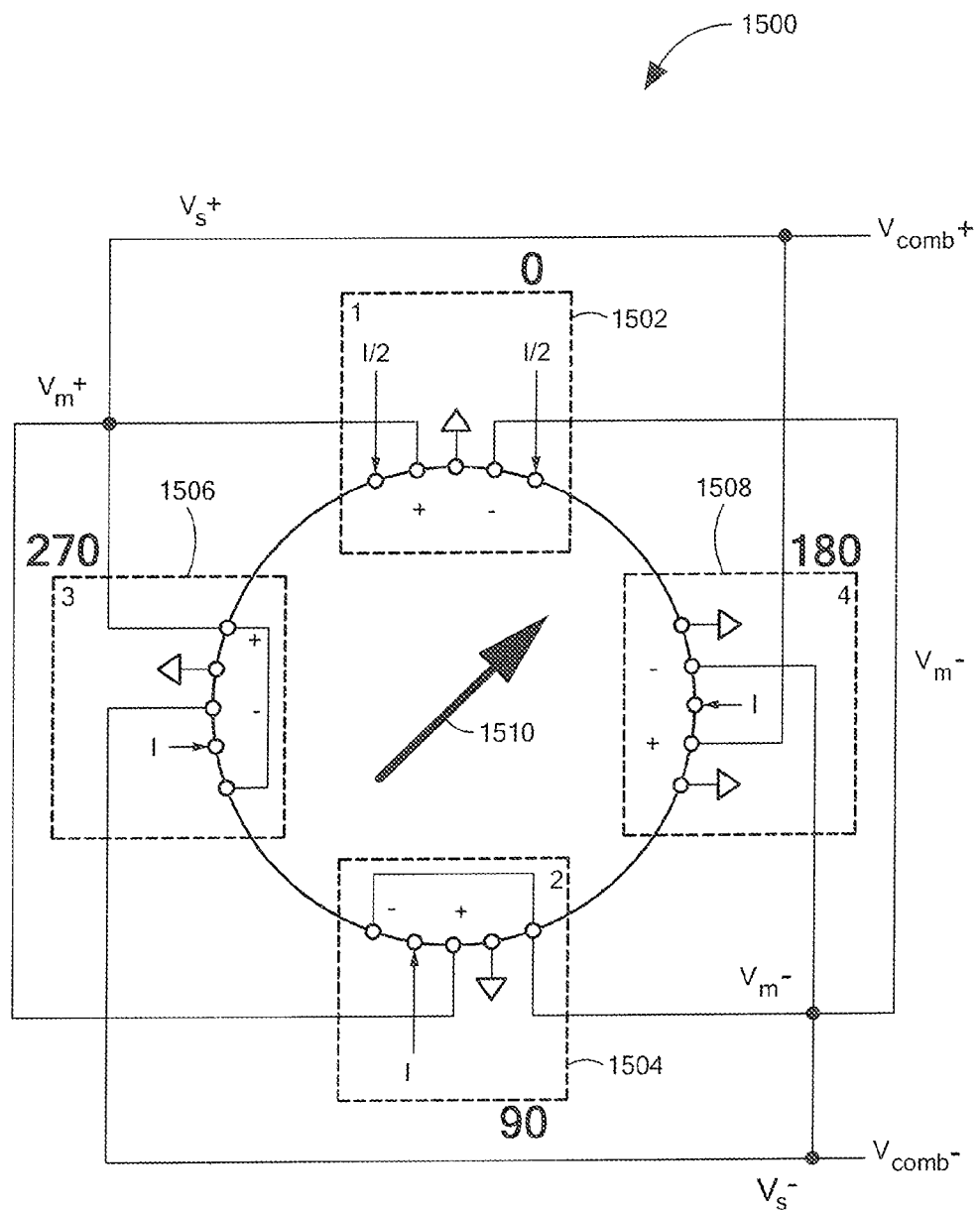
FIG. 15 is a block diagram showing another exemplary coupling of four vertical Hall elements arranged in a circle.
Figure 16:
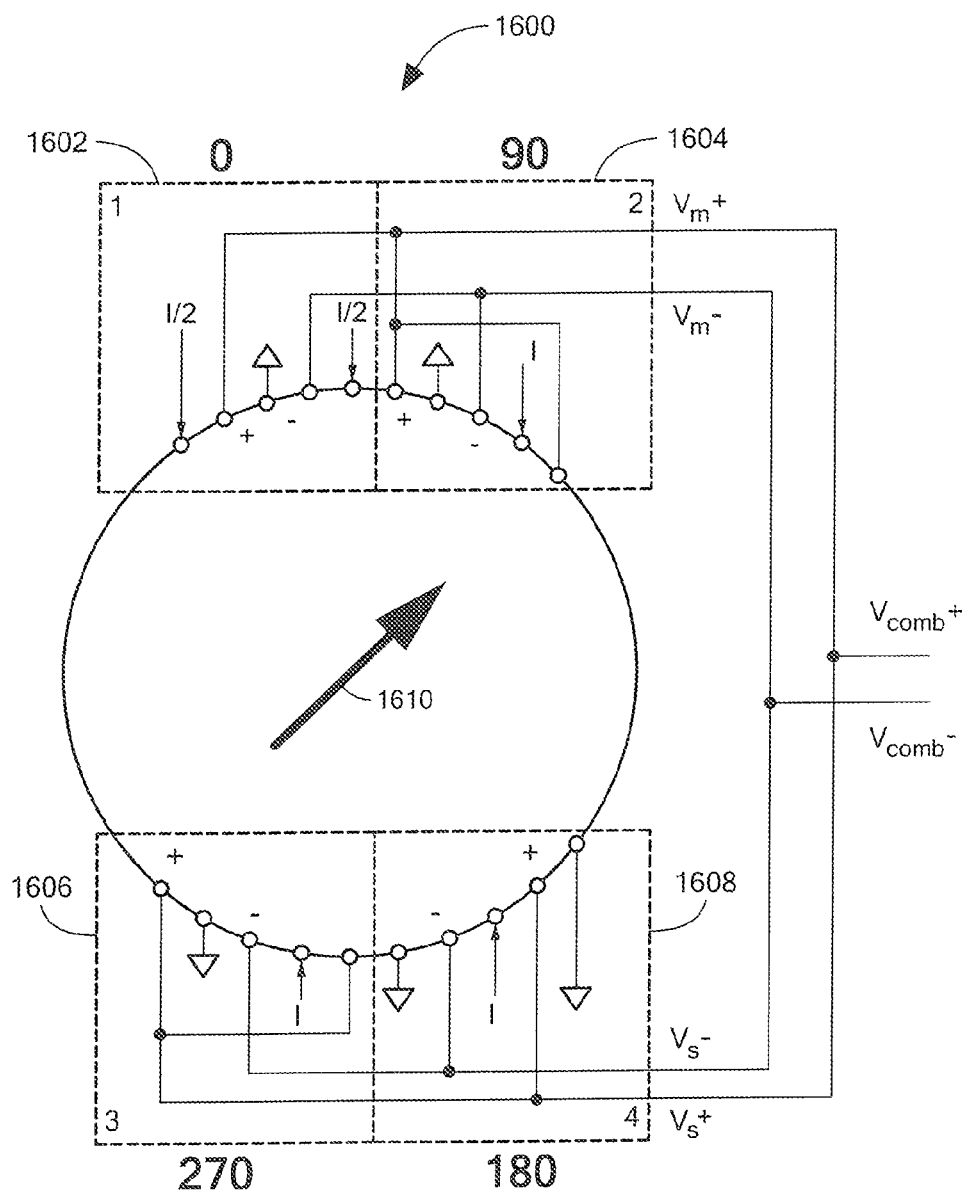
FIG. 16 is a block diagram showing yet another exemplary coupling of four vertical Hall elements arranged in a circle.

FIGS. 15 and 16 show arrangements in which a first pair of vertical Hall elements and a second pair of vertical Hall elements can be directly coupled together resulting in one respective differential output signal for each selected set of four vertical Hall elements as the sequence switches module 306 of FIG. 4 selects different sets of four vertical Hall elements in sequence.

The direct combination, like the arrangements of FIGS. 8 and 10, results in a reduction of residual offset, beyond the reduction described above in conjunction with FIG. 6. However, the constructive combinations of FIGS. 15 and 16 are four-way constructive combinations among four vertical Hall elements. A four-way combination results in but one output signal and the phase adjustment circuit 307 is not needed.

Referring now to FIG. 15, another coupling arrangement 1500 is shown.

A first vertical Hall element 1502 is arranged in a zero degree phase arrangement of FIG. 4, a second vertical Hall element 1504 is arranged in a ninety degree phase arrangement of FIG. 4B, a third vertical hall element 1506 is arranged in a two hundred seventy degree phase arrangement of FIG. 4C, and a fourth vertical Hall element 1508 is arranged in a one hundred eighty degree phase arrangement of FIG. 4A.

The couplings shown among the four vertical Hall elements can be accomplished, for example, by way of the sequence switches circuit 304 of FIG. 3 and the current switched circuit 306 of FIG. 3.

In some embodiments, the four vertical Hall elements 1502, 1504, 1506, 1508 are vertical Hall elements within a CVH sensing element, for example, within the CVH sensing element 12 of FIG. 1 or the CVH sensing element 302 of FIG. 3. In other embodiments, the four vertical Hall elements 1502, 1504, 1506, 1508 are separately isolated vertical Hall elements, as may be represented by the arrangement of FIG. 1A.

A line between the third and fourth vertical Hall elements 1506, 1508 is ninety from a line between the first and second vertical Hall elements 1502, 1504. Other physical arrangements are also possible, some of which are described herein.

The first and second vertical Hall elements 1502, 1504, respectively, are coupled together constructively in the same way as vertical Hall elements 802, 804 of FIG. 8. The third and fourth vertical Hall elements 1506, 1508, respectively, are also coupled together constructively as shown. The two constructive combinations are also constructively combined to result in one differential output signal (Vcomb+, Vcomb−).

In response to an exemplary static magnetic field 1510, a constructive sum of all four vertical Hall elements yields:

$$V\text{comb}+,V\text{comb}-=(V\text{ext1}+V\text{ext2})/4+(V\text{off1}-V\text{off2})/4+ (V\text{ext3}+V\text{ext4})/4+(V\text{off3}-V\text{off4})/4,$$

which approximately equals Vext. (notations 1, 2, 3, and 4 refer to the first, second, third and fourth vertical Hall elements 1502, 1504, 1506, 1508, respectively)

A remaining residual offset, Voffresc, is smaller than the individual instances of Voffresa and Voffresb described above in conjunction with FIGS. 6-14.

It should be noted that all combinations in FIG. 15 are constructive combinations. In essence, first and second vertical Hall elements 1502, 1504 are constructively combined, third and fourth vertical Hall elements 1506, 1508 are constructively combined, and the two pairs are also constructively combined with each other. Using the current spinning phases (i.e., current spinning phase differences) shown, the offsets cancel or nearly cancel in the differential signal (Vcomb+, Vcomb−) to result in the residual offset, Voffresc.

Constructive combinations tend to be advantageous because a desired external magnetic field component, Vext, adds, resulting, in a combined signal with a larger ratio of resulting external magnetic field component versus residual offset component.

In other embodiments, it is possible to constructively combine other current spinning phases to achieve a similar result. For example, in one alternative embodiments, the third vertical Hall element 1506 could be coupled in a current spinning phase arrangement of ninety degrees according to FIG. 4B, and the fourth vertical Hall element 1508 could be coupled in a zero degree current spinning phase arrangement according to FIG. 4. Retaining constructive combinations would yield similar results to those described above.

The various embodiments in accordance with FIG. 15 all have characteristics in common, namely, they all produce the same polarity of external magnetic field component, Vext, from each vertical Hall element in response to the exemplary magnetic field 1510. Also, the offset voltages among the vertical Hall elements cancel when all signals are constructively combined.

The various embodiments taught in conjunction with FIG. 15, each produce but one output signal (Vcomb+, Vcomb−), and hence, but one offset error vector, similar to the one offset vector of FIG. 7. Thus, it is not necessary to phase compensate between two signals as described above in conjunction with FIGS. 8 and 9. Furthermore, there are not two offset vectors, the phase of which is related to a physical angular displacement of vertical Hall elements as described above in conjunction with FIGS. 8-10. Thus, the four vertical Hall elements 1502, 1504, 1506, 1508 can be angularly displaced from the positions shown while maintaining a similar result. One such angular displacement is shown below in conjunction with FIG. 16.

Sequencing or stepping around a circle of vertical Hall elements and chopping or current spinning of the vertical Hall elements can be the same as or similar to that described above in conjunction with FIG. 6.

Referring now to FIG. 16, another coupling arrangement 1600 is shown.

A first vertical Hall element 1602 is arranged in a zero degree current spinning phase arrangement of FIG. 4, a second vertical Hall element 1604 is arranged in a ninety degree phase arrangement of FIG. 4B, a third vertical hall element 1606 is arranged in a two hundred seventy degree phase arrangement of FIG. 4C, and a fourth vertical Hall element 1608 is arranged in a one hundred eighty degree phase arrangement of FIG. 4A.

The couplings shown among the four vertical Hall elements can be accomplished, for example, by way of the sequence switches circuit 304 of FIG. 3 and the current switched circuit 306 of FIG. 3.

In some embodiments, the four vertical Hall elements 1602, 1604, 1606, 1608 are vertical Hall elements within a CVH sensing element, for example, within the CVH sensing element 12 of FIG. 1 or the CVH sensing element 302 of FIG. 3. In other embodiments, the four vertical Hall elements 1602, 1604, 1606, 1608 are separately isolated vertical Hall elements, as may be represented by the arrangement of FIG. 1A.

A line between the first and fourth vertical Hall elements 1602, 1608 is rotated less than ninety degrees, e.g., twenty degrees, from a line between the second and third vertical Hall elements 1604, 1606. Other physical arrangements are also possible, some of which are described herein.

The first and second vertical Hall elements 1602, 1604, respectively, are coupled together constructively in the same way as vertical Hall elements 802, 804 of FIG. 8. The third and fourth vertical Hall elements 1606, 1608 are also coupled together constructively as shown. The two constructive combinations are also constructively combined to result in one differential output signal (Vcomb+, Vcomb−).

In response to an exemplary magnetic field 1610, a constructive sum of all four vertical Hall elements yields:

$$V\text{comb}+,V\text{comb}-=(V\text{ext1}+V\text{ext2})/4+(V\text{off1}-V\text{off2})/4+ (V\text{ext3}+V\text{ext4})/4+(V\text{off3}-V\text{off4})/4,$$

which approximately equals Vext. (notations 1, 2, 3, and 4 refer to the first, second, third and fourth vertical Hall elements 1602, 1604, 1606, 1608, respectively)

A remaining residual offset, Voffresc, is smaller than the individual instances of Voffresa and Voffresb described above in conjunction with FIGS. 6-14. Characteristics and advantages of four-way constructive coupling are described above in conjunction with FIG. 15. The same characteristics and advantages apply to the arrangement of FIG. 16.

Sequencing or stepping around a circle of vertical Hall elements and chopping or current spinning of the vertical Hall elements can be the same as or similar to that described above in conjunction with FIG. 6.

Figure 17:
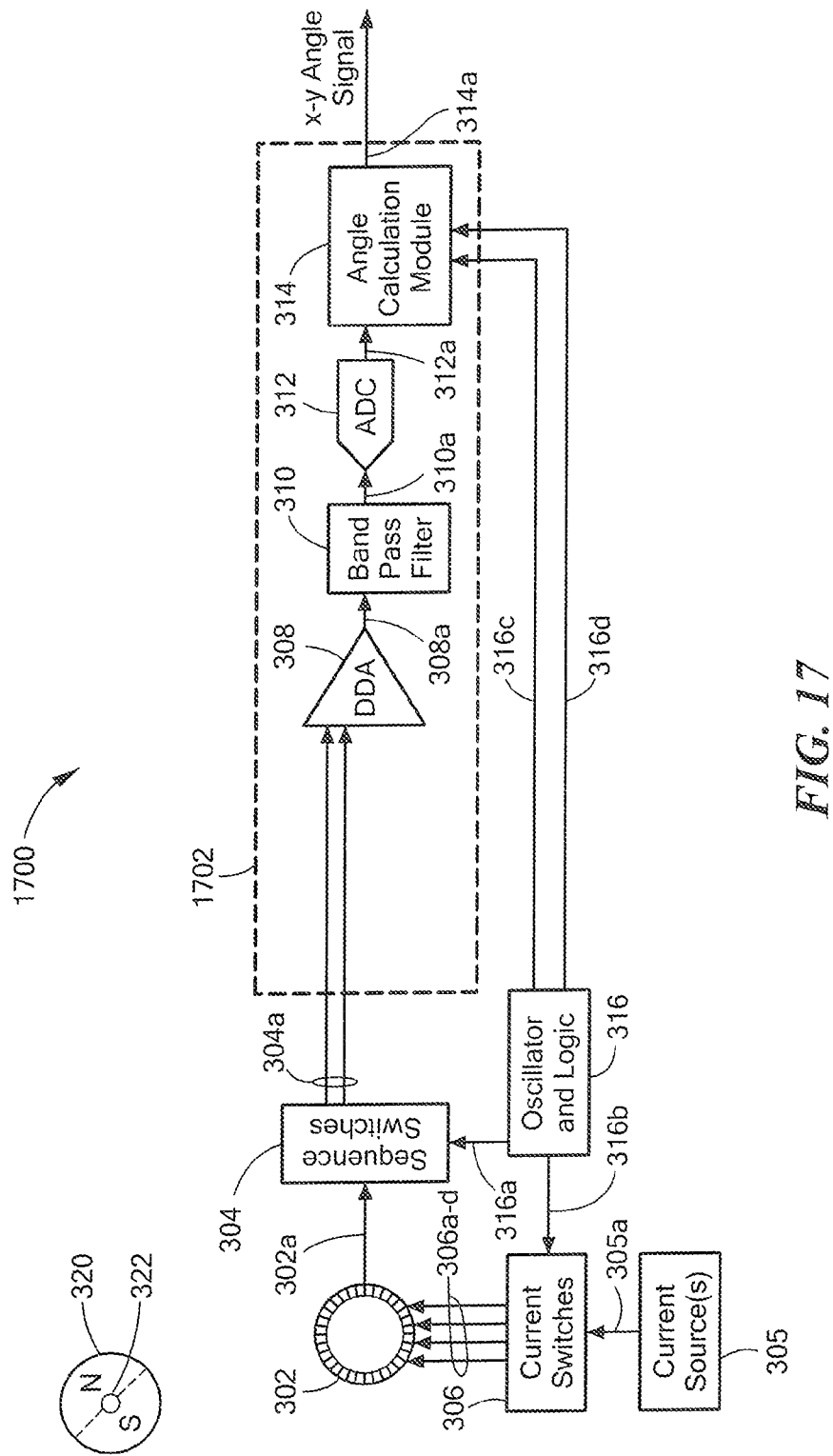
FIG. 17 is a block diagram of a magnetic field sensor that can be used with the coupling arrangements of FIG. 15 or 16.

Referring now to FIG. 17, in which like elements of FIG. 3 are shown having like reference designations, a magnetic field sensor 1700 is like the magnetic field sensor 300 of FIG. 3, however, the magnetic field sensor 1700 does not include the phase adjustment module 307 of FIG. 3. Furthermore, a sequence switches circuit 1702 provides only one differential signal 1702a to a differential amplifier 1704.

The magnetic field sensor 1700 can be used with the coupling arrangements of FIGS. 15 and 16, in which all four vertical Hall elements are constructively coupled together and for which there is only one differential output signal (Vcomb+, Vcomb−).

As described above, in the embodiments described above in conjunction with FIGS. 15 and 16, there is no need for phase adjustment since there is only one differential output signal (Vcomb+, Vcomb−), and thus, only one offset error signal component. However, in other embodiments, vertical Hall elements with the current spinning phases shown above in FIGS. 15 and 16 can be used but with different couplings. For these other embodiments, the phase adjustment module 307 can be used to still result in cancellation or near cancellation of residual offset voltages.

While particular vertical Hall elements with particular phase arrangements and with particular couplings to other vertical Hall elements are shown above, and also particular physical angular arrangements are shown between vertical Hall elements, it should be understood that there are other phase arrangements, couplings, and physical angular arrangements that can accomplish lower offset voltages.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
a plurality of vertical Hall elements arranged in a circle and formed as a corresponding plurality of sets of contacts among a plurality of contacts disposed upon a substrate, wherein the plurality of vertical Hall elements is configured to generate a corresponding plurality of vertical Hall element output signals, wherein each one of the plurality of vertical Hall elements is responsive to an external magnetic field having an external magnetic field direction, wherein each one of the vertical Hall element output signals comprises a respective external magnetic field component responsive to the external magnetic field and a respective offset error component;
a sequence switches circuit coupled to receive the plurality of vertical Hall element output signals and configured to select first and second vertical Hall elements from among the plurality of vertical Hall elements, the first vertical Hall element having a first selected set of contacts selected from among the plurality of sets of contacts and the second vertical Hall element having a second selected set of contacts selected from among the plurality of sets of contacts, wherein the first and second vertical Hall elements are configured to generate first and second vertical Hall element output signals, respectively, wherein the first vertical Hall element output signal has a first external magnetic field component responsive to the external magnetic field and a first offset component, and wherein the second vertical Hall element output signal has a second external magnetic field component responsive to the external magnetic field and a second offset component, wherein the sequence switches circuit is further configured to combine the first and second vertical Hall element output signals so that the first and second magnetic field components add constructively to generate a constructive signal; and
a current switches circuit coupled to receive a current signal and configured to provide a first one or more current signals to a first selected one or more contacts of the first selected set of contacts, wherein the first one or more current signals flow into or out of a central contact of the first selected set of contacts, and to provide a second one or more current signals to a second selected one or more contacts of the second selected set of contacts, wherein the second one or more current signals flow into or out of a contact proximate to a central contact of the second selected set of contacts, wherein the first and second selected one or more contacts of the first and second vertical Hall elements are representative of first and second different coupling phases corresponding to first and second different current spinning phases, respectively, wherein the sequence switches circuit and the current switches circuit are configured to sequence around the plurality of vertical Hall elements, sequentially selecting the first and second vertical Hall elements as different ones of the plurality of vertical Hall elements in order to generate a constructive sequenced signal.

2. The magnetic field sensor of claim 1, wherein the plurality of contacts are disposed over a common implant and diffusion region in the substrate forming a circular vertical Hall (CVH) sensing element.

3. The magnetic field sensor of claim 2, wherein the sequence switches circuit is further configured to select third and fourth vertical Hall elements from among the plurality of vertical Hall elements, the third vertical Hall element having a third selected set of contacts selected from among the plurality of sets of contacts and the fourth vertical Hall element having a fourth selected set of contacts selected from among the plurality of sets of contacts, wherein the third and fourth vertical Hall elements are configured to generate third and fourth vertical Hall element output signals, respectively, wherein the third vertical Hall element output signal has a third external magnetic field component responsive to the external magnetic field and a third offset component, and wherein the fourth vertical Hall element output signal has a fourth external magnetic field component responsive to the external magnetic field and a fourth offset component, wherein the sequence switches circuit is further configured to combine the third and fourth vertical Hall element output signals together to generate a compensating signal.

4. The magnetic field sensor of claim 3, wherein the sequence switches circuit is configured to combine the third and fourth vertical Hall element output signals together such that the third and fourth external magnetic field components add destructively.

5. The magnetic field sensor of claim 3, wherein the sequence switches circuit is configured to combine the third and fourth vertical Hall element output signals together such that the third and fourth external magnetic field components add constructively.

6. The magnetic field sensor of claim 3, wherein the current switches circuit is further configured to provide a third one or more current signals to a third selected one or more contacts of the third selected set of contacts and to provide a fourth one or more current signals to a fourth selected one or more contacts of the fourth selected set of contacts, wherein the sequence switches circuit and the current switches circuit are configured to sequence around the plurality of vertical Hall elements, sequentially selecting the third and fourth vertical Hall elements as different ones of the plurality of vertical Hall elements in order to generate a compensating sequenced signal, wherein the magnetic field sensor further comprises:
a combining circuit coupled to the sequence switches circuit and configured to combine a first signal representative of the constructive sequenced signal and a second signal representative of the compensating sequenced signal to generate a combined sequenced signal.

7. The magnetic field sensor of claim 6, wherein the third one or more current signals flow into or out of a central contact of the third selected set of contacts, and wherein the fourth one or more current signals flow into or out of a central contact of the fourth selected set of contacts, wherein the third and fourth selected one or more contacts of the third and fourth vertical Hall elements are representative of the same coupling phase.

8. The magnetic field sensor of claim 6, wherein the third one or more current signals flow into or out of a contact proximate to a central contact of the third selected set of contacts, and wherein the fourth one or more current signals flow into or out of a contact proximate to a central contact of the fourth selected set of contacts.

9. The magnetic field sensor of claim 6, wherein the third one or more current signals flow into or out of a contact proximate to a central contact of the third selected set of contacts, and wherein the fourth one or more current signals flow into or out of a central contact of the fourth selected set of contacts, wherein the third and fourth selected one or more contacts of the third and fourth vertical Hall elements are representative of the different coupling phases.

10. The magnetic field sensor of claim 6, further comprising a phase adjustment module coupled between the sequence switches circuit and the combining circuit and configured to apply a predetermined phase adjustment to a selected one of the constructive sequenced signal or the compensating sequenced signal to generate a respective one of the first signal or the second signal.

11. The magnetic field sensor of claim 6, wherein the first and second vertical Hall elements are disposed one hundred eighty degrees apart around the circle.

12. The magnetic field sensor of claim 11, wherein the third and fourth vertical Hall elements are disposed one hundred eighty degrees apart around the circle, wherein a line between centers of the first and second vertical Hall elements and a line between centers of the third and fourth vertical Hall elements are approximately ninety degrees apart.

13. The magnetic field sensor of claim 6, wherein the first and second vertical Hall elements are immediately adjacent to each other and the third and fourth vertical Hall elements are immediately adjacent to each other.

14. The magnetic field sensor of claim 13, wherein the first and fourth vertical Hall elements are disposed one hundred eighty degrees apart around the circle, and wherein the second and third vertical Hall elements are disposed one hundred eighty degrees apart around the circle.

15. The magnetic field sensor of claim 6, wherein the first and fourth vertical Hall elements are disposed one hundred eighty degrees apart around the circle, and wherein the second and third vertical Hall elements are disposed one hundred eighty degrees apart around the circle.

16. The magnetic field sensor of claim 2, wherein the first and second vertical Hall elements are disposed one hundred eighty degrees apart around the circle.

17. The magnetic field sensor of claim 1, wherein the sequence switches circuit is further configured to select third and fourth vertical Hall elements from among the plurality of vertical Hall elements, the third vertical Hall element having a third selected set of contacts selected from among the plurality of sets of contacts and the fourth vertical Hall element having a fourth selected set of contacts selected from among the plurality of sets of contacts, wherein the third and fourth vertical Hall elements are configured to generate third and fourth vertical Hall element output signals, respectively, wherein the third vertical Hall element output signal has a third external magnetic field component responsive to the external magnetic field and a third offset component, and wherein the fourth vertical Hall element output signal has a fourth external magnetic field component responsive to the external magnetic field and a fourth offset component, wherein the sequence switches circuit is further configured to combine the third and fourth vertical Hall element output signals together to generate a compensating signal.

18. The magnetic field sensor of claim 17, wherein the current switches circuit is further configured to provide a third one or more current signals to a third selected one or more contacts of the third selected set of contacts and to provide a fourth one or more current signals to a fourth selected one or more contacts of the fourth selected set of contacts, wherein the sequence switches circuit and the current switches circuit are configured to sequence around the plurality of vertical Hall elements, sequentially selecting the third and fourth vertical Hall elements as different ones of the plurality of vertical Hall elements in order to generate a compensating sequenced signal, wherein the magnetic field sensor further comprises:

a combining circuit coupled to the sequence switches circuit and configured to combine a first signal representative of the constructive sequenced signal and a second signal representative of the compensating sequenced signal to generate a combined sequenced signal.

19. The magnetic field sensor of claim 18, further comprising a phase adjustment module coupled between the sequence switches circuit and the combining circuit and configured to apply a predetermined phase adjustment to a selected one of the constructive sequenced signal or the compensating sequenced signal to generate a respective one of the first signal or the second signal.

20. A method used in a magnetic field sensor, the magnetic field sensor comprising a plurality of vertical Hall elements arranged as a circle and formed as a corresponding plurality of sets of contacts among a plurality of contacts disposed upon a substrate, wherein the plurality of vertical Hall elements is configured to generate a corresponding plurality of vertical Hall element output signals, wherein each one of the plurality of vertical Hall elements is responsive to an external magnetic field having an external magnetic field direction, wherein each one of the vertical Hall element output signals comprises a respective external magnetic field component responsive to the external magnetic field and a respective offset error component, wherein the method comprises:

selecting first and second vertical Hall elements from among the plurality of vertical Hall elements, the first vertical Hall element having a first selected set of contacts selected from among the plurality of sets of contacts and the second vertical Hall element having a second selected set of contacts selected from among the plurality of sets of contacts, wherein the first and second vertical Hall elements are configured to generate first and second vertical Hall element output signals, respectively, wherein the first vertical Hall element output signal has a first external magnetic field component responsive to the external magnetic field and a first offset component, and wherein the second vertical Hall element output signal has a second external magnetic field component responsive to the external magnetic field and a second offset component;

combining the first and second vertical Hall element output signals so that the first and second magnetic field components add constructively to generate a constructive signal;

providing a first one or more current signals to a first selected one or more contacts of the first selected set of contacts, wherein the first one or more current signals flow into or out of a central contact of the first selected set of contacts;

providing a second one or more current signals to a second selected one or more contacts of the second selected set of contacts, wherein the second one or more current signals flow into or out of a contact proximate to a central contact of the second selected set of contacts, wherein the first and second one or more contacts of the first and second vertical Hall elements are representative of first and second different coupling phases, corresponding to first and second different current spinning phases, respectively; and sequencing around the plurality of vertical Hall elements, sequentially selecting the first and second vertical Hall elements as different ones of the plurality of vertical Hall elements in order to generate a constructive sequenced signal.

21. The method of claim 20, wherein the plurality of contacts are disposed over a common implant and diffusion region in the substrate forming a circular vertical Hall (CVH) sensing element.

22. The method of claim 21, further comprising:
selecting third and fourth vertical Hall elements from among the plurality of vertical Hall elements, the third vertical Hall element having a third selected set of contacts selected from among the plurality of sets of contacts and the fourth vertical Hall element having a fourth selected set of contacts selected from among the plurality of sets of contacts, wherein the third and fourth vertical Hall elements are configured to generate third and fourth vertical Hall element output signals, respectively, wherein the third vertical Hall element output signal has a third external magnetic field component responsive to the external magnetic field and a third offset component, and wherein the fourth vertical Hall element output signal has a fourth external magnetic field component responsive to the external magnetic field and a fourth offset component; and combining the third and fourth vertical Hall element output signals together to generate a compensating signal.

23. The method claim 22, wherein the combining the third and fourth vertical Hall element output signals results in the third and fourth external magnetic field components adding destructively.

24. The method of claim 22, wherein the combining the third and fourth vertical Hall element output signals results in the third and fourth external magnetic field components adding constructively.

25. The method of claim 22, further comprising:
providing a third one or more current signals to a third selected one or more contacts of the third selected set of contacts;
providing a fourth one or more current signals to a fourth selected one or more contacts of the fourth selected set of contacts;
sequencing around the plurality of vertical Hall elements, sequentially selecting the third and fourth vertical Hall elements as different ones of the plurality of vertical Hall elements in order to generate a compensating sequenced signal; and
combining a first signal representative of the constructive sequenced signal and a second signal representative of the compensating sequenced signal.

26. The method of claim 25, wherein the third one or more current signals flow into or out of a central contact of the third selected set of contacts, and wherein the fourth one or more current signals flow into or out of a central contact of the fourth selected set of contacts, wherein the third and fourth selected one or more contacts of the third and fourth vertical Hall elements are representative of the same coupling phase.

27. The method of claim 25, wherein the third one or more current signals flow into or out of a contact proximate to a central contact of the third selected set of contacts, and wherein the fourth one or more current signals flow into or out of a contact proximate to a central contact of the fourth selected set of contacts.

28. The method of claim 25, wherein the third one or more current signals flow into or out of a contact proximate to a central contact of the third selected set of contacts, and wherein the fourth one or more current signals flow into or out of a central contact of the fourth selected set of contacts, wherein the third and fourth selected one or more contacts of the third and fourth vertical Hall elements are representative of the different coupling phases.

29. The method of claim 25, further comprising:
applying a predetermined phase adjustment to a selected one of the constructive sequenced signal or the compensating sequenced signal to generate a respective one of the first signal or the second signal.

30. The method of claim 25, wherein the first and second vertical Hall elements are disposed one hundred eighty degrees apart around the circle.

31. The method of claim 30, wherein the third and fourth vertical Hall elements are disposed one hundred eighty degrees apart around the circle, wherein a line between centers of the first and second vertical Hall elements and a line between centers of the third and fourth vertical Hall elements are approximately ninety degrees apart.

32. The method of claim 25, wherein the first and second vertical Hall elements are immediately adjacent to each other and the third and fourth vertical Hall elements are immediately adjacent to each other.

33. The method of claim 32, wherein the first and fourth vertical Hall elements are disposed one hundred eighty degrees apart around the circle, and wherein the second and third vertical Hall elements are disposed one hundred eighty degrees apart around the circle.

34. The method of claim 25, wherein the first and fourth vertical Hall elements are disposed one hundred eighty degrees apart around the circle, and wherein the second and third vertical Hall elements are disposed one hundred eighty degrees apart around the circle.

35. The method of claim 21, wherein the first and second vertical Hall elements are disposed one hundred eighty degrees apart around the circle.

36. The method of claim 20, further comprising:
selecting third and fourth vertical Hall elements from among the plurality of vertical Hall elements, the third vertical Hall element having a third selected set of contacts selected from among the plurality of sets of contacts and the fourth vertical Hall element having a fourth selected set of contacts selected from among the plurality of sets of contacts, wherein the third and fourth vertical Hall elements are configured to generate third and fourth vertical Hall element output signals, respectively, wherein the third vertical Hall element output signal has a third external magnetic field component responsive to the external magnetic field and a third offset component, and wherein the fourth vertical Hall element output signal has a fourth external magnetic field component responsive to the external magnetic field and a fourth offset component; and combining the third and fourth vertical Hall element output signals together to generate a compensating signal.

37. The method of claim 36, further comprising:

providing a third one or more current signals to a third selected one or more contacts of the third selected set of contacts;

providing a fourth one or more current signals to a fourth selected one or more contacts of the fourth selected set of contacts;

sequencing around the plurality of vertical Hall elements, sequentially selecting the third and fourth vertical Hall elements as different ones of the plurality of vertical Hall elements in order to generate a compensating sequenced signal; and combining a first signal representative of the constructive sequenced signal and a second signal representative of the compensating sequenced signal.

38. The method of claim 37, further comprising:

applying a predetermined phase adjustment to a selected one of the constructive sequenced signal or the compensating sequenced signal to generate a respective one of the first signal or the second signal.

* * * * *

UNITED STATES PATENT AND TRADEMARK OFFICE
CERTIFICATE OF CORRECTION

| | | |
|---|---|---|
| PATENT NO. | : 9,547,048 B2 | Page 1 of 3 |
| APPLICATION NO. | : 14/155047 | |
| DATED | : January 17, 2017 | |
| INVENTOR(S) | : Hernan D. Romero | |

It is certified that error appears in the above-identified patent and that said Letters Patent is hereby corrected as shown below:

On the Title Page

Abstract (57), delete "to generated" and replace with --to generate--.

In the Specification

Column 1, Line 29, delete "and angle" and replace with --an angle--.

Column 2, Line 16, delete "herein" and replace with --herein as--.

Column 2, Line 18, delete "of and" and replace with --of an--.

Column 2, Line 24, delete "i.e." and replace with --i.e.,--.

Column 5, Line 20, delete "type semiconductor" and replace with --type III-IV semiconductor--.

Column 8, Line 41, delete "CVH sensing and 302." and replace with --CVH sensing element 302.--.

Column 8, Line 57, delete "to both the" and replace with --that the--.

Column 9, Line 27, delete "360" and replace with --316--.

Column 9, Line 50, delete "chopped one of the time" and replace with --chopped one at a time--.

Column 10, Line 13, delete "vertical a Hall" and replace with --vertical Hall--.

Column 10, Line 28, delete "105$a$" and replace with --Vm--.

Column 10, Line 42, delete "Hal element" and replace with --Hall element--.

Signed and Sealed this
Thirtieth Day of October, 2018

Andrei Iancu
*Director of the United States Patent and Trademark Office*

CERTIFICATE OF CORRECTION (continued)
U.S. Pat. No. 9,547,048 B2

Column 11, Line 51, delete "contact" and replace with --contacts--.

Column 12, Line 42, delete "relative the signals" and replace with --relative to the signals--.

Column 13, Line 11, delete "a variety factors" and replace with --a variety of factors--.

Column 14, Line 5, delete "$H_{nP}=$" and replace with --$H_{nP}(T)=$---.

Column 15, Line 14, delete "element 602, 604" and replace with --elements 602, 604--.

Column 15, Line 31, delete "that having a changing" and replace with --that have a changing--.

Column 16, Line 4, delete "element 602, 604" and replace with --elements 602, 604--.

Column 16, Line 24, delete "element 602, 604" and replace with --elements 602, 604--.

Column 16, Line 45, delete "arrangement of vertical" and replace with --arrangement, the vertical--.

Column 16, Line 51, delete "that a magnetic field components" and replace with --that magnetic field components--.

Column 16, Line 64, delete "element 602, 604" and replace with --elements 602, 604--.

Column 17, Line 17, delete "first harmonic the" and replace with --first harmonic of the--.

Column 18, Lines 1-2, delete "current switched" and replace with --current switches--.

Column 18, Line 13, delete "element 602, 604" and replace with --elements 602, 604--.

Column 19, Line 20, delete "can" and replace with --and can--.

Column 19, Line 48, delete "first harmonic the" and replace with --first harmonic of the--.

Column 19, Line 55, delete "first harmonic the" and replace with --first harmonic of the--.

Column 20, Line 1, delete "eight" and replace with --eighty--.

Column 20, Line 26, delete "switched" and replace with --switches--.

Column 20, Line 37, delete "element 802, 804" and replace with --elements 802, 804--.

Column 20, Line 53, delete "element 602, 604" and replace with --elements 602, 604--.

Column 22, Line 33, delete "elements 1004" and replace with --element 1004--.

Column 23, Line 56, delete "$2R^{\circ}$" and replace with --$2R^2$--.

CERTIFICATE OF CORRECTION (continued)
U.S. Pat. No. 9,547,048 B2

Column 24, Line 10, delete "$V\text{off}_0^0$" and replace with --$V\text{off}_1^0$--.

Column 24, Line 45, delete "switched" and replace with --switches--.

Column 24, Line 55, delete "ninety from" and replace with --ninety degrees from--.

Column 25, Line 5, delete "respectively)" and replace with --respectively).--.

Column 25, Line 27, delete "embodiments" and replace with --embodiment--.

Column 26, Line 7, delete "switched" and replace with --switches--.

Column 26, Line 51, delete "1702" and replace with --304--.

Column 26, Line 52, delete "1702$a$" and replace with --304$a$--.

Column 26, Line 52, delete "1704" and replace with --308--.

In the Claims

Column 31, Line 43, delete "method claim 22" and replace with --method of claim 22--.